(12) United States Patent
Sun et al.

(10) Patent No.: US 10,236,466 B2
(45) Date of Patent: Mar. 19, 2019

(54) ORGANIC LIGHT EMITTING DEVICE

(71) Applicant: NANYANG TECHNOLOGICAL UNIVERSITY, Singapore (SG)

(72) Inventors: Xiaowei Sun, Singapore (SG); Hilmi Volkan Demir, Singapore (SG); Swee Tiam Tan, Singapore (SG); Yongbiao Zhao, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 231 days.

(21) Appl. No.: 14/941,111

(22) Filed: Nov. 13, 2015

(65) Prior Publication Data

US 2016/0141542 A1    May 19, 2016

(30) Foreign Application Priority Data

Nov. 14, 2014 (SG) ............................ 10201407607Q

(51) Int. Cl.
*H01L 51/50* (2006.01)
*H01L 51/52* (2006.01)
*H01L 51/00* (2006.01)

(52) U.S. Cl.
CPC ...... *H01L 51/5072* (2013.01); *H01L 51/5278* (2013.01); *H01L 51/006* (2013.01); *H01L 51/0046* (2013.01); *H01L 51/0072* (2013.01); *H01L 51/0081* (2013.01); *H01L 51/5056* (2013.01); *H01L 2251/308* (2013.01)

(58) Field of Classification Search
CPC ............. H01L 51/0081; H01L 51/5056; H01L 51/5072; H01L 51/5278; H01L 51/0046; H01L 51/006; H01L 51/0072; H01L 2251/308
See application file for complete search history.

(56) References Cited

U.S. PATENT DOCUMENTS

| | | | |
|---|---|---|---|
| 7,075,231 B1 | 7/2006 | Liao et al. | |
| 7,494,722 B2 * | 2/2009 | Liao | H01L 51/5278 257/E51.022 |
| 7,955,719 B2 | 6/2011 | Hatwar et al. | |
| 2005/0264174 A1 | 12/2005 | Liao et al. | |
| 2005/0281082 A1 * | 12/2005 | Miyawaki | G11C 11/22 365/174 |
| 2006/0006796 A1 * | 1/2006 | Lee | B82Y 10/00 313/504 |
| 2006/0188745 A1 | 8/2006 | Liao et al. | |
| 2006/0240277 A1 * | 10/2006 | Hatwar | C09K 11/06 428/690 |
| 2007/0046189 A1 | 3/2007 | Hatwar et al. | |
| 2009/0001885 A1 | 1/2009 | Spindler et al. | |
| 2009/0140645 A1 * | 6/2009 | Lin | H01L 51/5088 313/504 |
| 2015/0200378 A1 * | 7/2015 | Reusch | H01L 51/5278 257/40 |

FOREIGN PATENT DOCUMENTS

| | | | |
|---|---|---|---|
| DE | 10 2012 214021 A1 * | 2/2014 | |
| WO | WO 2006/115848 A1 | 11/2006 | |
| WO | WO 2009/005597 A1 | 1/2009 | |

OTHER PUBLICATIONS

Chen C-W, Lu Y-J, Wu C-C, Wu EH-E, Chu C-W, Yang Y. Effective connecting architecture for tandem organic light-emitting devices. Appl Phys Lett 2005, 87(24): 241121.

Deng Y-H, Ou Q-D, Wang Q-K, Wei H-X, Li Y-Q, Lee S-T, et al. The role of charge generation layers in the operational stability of tandem organic light-emitting diodes. Journal of Materials Chemistry C 2014, 2(11): 1982-1989.

Chen S-Y, Chu T-Y, Chen J-F, Su C-Y, Chen Ch. Stable inverted bottom-emitting organic electroluminescent devices with molecular doping and morphology improvement. Appl Phys Lett 2006, 89(5): 053518.

You H, Dai Y, Zhang Z, Ma D. Improved performances of organic light-emitting diodes with metal oxide as anode buffer. J Appl Phys 2007, 101(2): 026105.

Zhao Y, Zhang J, Liu S, Gao Y, Yang X, Leck KS, et al. Transition metal oxides on organic semiconductors. Organic Electronics 2014, 15(4): 871-877.

Tang CW, Vanslyke SA. Organic Electroluminescent Diodes. Appl Phys Lett 1987, 51(12): 913-915.

Fery C, Racine B, Vaufrey D, Doyeux H, Cinà S. Physical mechanism responsible for the stretched exponential decay behavior of aging organic light-emitting diodes. Appl Phys Lett 2005, 87(21): 213502.

Kido J, Matsumoto T, Nakada T, Endo J, Mori K, Kawamura N, et al. 27.1: Invited Paper: High Efficiency Organic EL Devices having Charge Generation Layers. SID Symposium Digest of Technical Papers 2003, 34(1): 964-965.

Liao LS, Klubek KP, Tang CW. High-efficiency tandem organic light-emitting diodes. Appl Phys Lett 2004, 84(2): 167-169.

Lai SL, Chan MY, Fung MK, Lee CS, Lee ST. Copper hexadecafluorophthalocyanine and copper phthalocyanine as a pure organic connecting unit in blue tandem organic light-emitting devices. Journal of Applied Physics 2007, 101(1): 014509.

Chen YH, Ma DG. Organic semiconductor heterojunctions as charge generation layers and their application in tandem organic light-emitting diodes for high power efficiency. Journal of Materials Chemistry 2012, 22(36): 18718-18734.

(Continued)

*Primary Examiner* — Anca Eoff
(74) *Attorney, Agent, or Firm* — Alston & Bird LLP

(57) ABSTRACT

According to one embodiment, an organic light emitting device is described including a first light emitting unit, a second light emitting unit and a charge generation layer wherein the second light emitting unit is stacked over the first light emitting unit and is connected to the first light emitting unit by means of the charge generation layer and wherein the charge generation layer includes an electron transport layer, a transition metal oxide layer arranged over the electron transport layer and a diffusion suppressing layer arranged between the electron transport layer and the transition metal oxide layer to separate the electron transport layer from the transition metal oxide layer.

1 Claim, 26 Drawing Sheets

(56) References Cited

OTHER PUBLICATIONS

Qi X, Li N, Forrest Sr. Analysis of metal-oxide-based charge generation layers used in stacked organic light-emitting diodes. Journal of Applied Physics 2010, 107(1): 014514.

Liao LS, Klubek KP. Power efficiency improvement in a tandem organic light-emitting diode. Appl Phys Lett 2008, 92(22): 223311.

Kroeger M, Hamwi S, Meyer J, Riedl T, Kowalsky W, Kahn A. Role of the deep-lying electronic states of MoO3 in the enhancement of hole-injection in organic thin films. Appl Phys Lett 2009, 95(12): 123301.

Bao QY, Yang JP, Tang JX, Li YQ, Lee CS, Lee ST. Interfacial electronic structures of WO3-based intermediate connectors in tandem organic light-emitting diodes. Organic Electronics 2010, 11(9): 1578-1583.

Hamwi S, Meyer J, Kroger M, Winkler T, Witte M, Riedl T, et al. The Role of Transition Metal Oxides in Charge-Generation Layers for Stacked Organic Light-Emitting Diodes. Adv Funct Mater 2010, 20(11): 1762-1766.

Meyer J, Hamwi S, Kroger M, Kowalsky W, Riedl T, Kahn A. Transition Metal Oxides for Organic Electronics: Energetics, Device Physics and Applications. Advanced Materials 2012, 24(40): 5408-5427.

Leem DS, Lee JH, Kim JJ, Kang JW. Highly efficient tandem p-i-n organic light- emitting diodes adopting a low temperature evaporated rhenium oxide interconnecting layer. Appl Phys Lett 2008, 93(10): 103304.

Diez C, Reusch TCG, Lang E, Dobbertin T, Brütting W. Highly stable charge generation layers using caesium phosphate as n-dopants and inserting interlayers. Journal of Applied Physics 2012, 111(10): 103107.

\* cited by examiner

Tandem OLED with DSL

ORGANIC LIGHT EMITTING DEVICE

CROSS-REFERENCE TO RELATED APPLICATIONS

This application claims priority to Singapore Application No. 10201407607Q, filed on Nov. 14, 2014, which is hereby incorporated herein in its entirety by reference.

TECHNICAL FIELD

The present disclosure relates to organic light emitting devices.

BACKGROUND

Organic light-emitting diodes (OLEDs) have attracted much attention over past three decades, owing to their high potential in next generation displays and lighting panels. However, before mass production of OLEDs for the consumer market can start, a long operating lifetime must be ensured. An elegant way to meet this requirement is to stack a number of OLEDs on top of each other, which is the so called tandem OLEDs technology. In a tandem OLED, the interconnecting units between two sub-OLEDs that serve as charge generation layers (CGLs) are required when driving OLED stacks as two-terminal devices. Up to now, several CGL structures have been reported, such as n-doped electron transporting layer (ETL)/p-doped hole transporting layer (HTL) (e.g., $Alq_3$(Tris(8-hydroxyquinolinato)aluminium): Li(Lithium)/NPB(ninhydrin petroleum ether):$FeCl_3$ (iron chloride)), organic p/n junction (e.g., CuPc(Copper(II) phthalocyanine)/F16CuPc(Copper(II) 1,2,3,4,8,9,10,11,15, 16,17,18,22,23,24,25-hexadecafluoro-29H,31H-phthalocyanine), Pentacene/C60 (Buckminsterfullerene)) and n-doped ETL/electron acceptor/HTL structure (e.g., BCP (Bathocuproine):Li/$MoO_3$ (Molybdenum trioxide)/NPB, Bphen(Bathophenanthroline):Li/HAT-CN(1,4,5,8,9,11-hexaazatriphenylene-hexacarbonitrile)/NPB). Among them, the use of transition metal oxides (TMOs), such as $WO_3$ (Tungsten trioxide), $MoO_3$, $V_2O_5$(Vanadium oxide) and $ReO_3$ (Rhenium (VI) oxide) as the electron acceptor in the n-doped ETL/electron acceptor/HTL structure has been intensively studied, due to their low cost, easy synthesis and easy handling compared to their organic counterpart. To achieve the long term stability of tandem OLEDs, the CGL itself should be stable enough under the electrical stressing. However, the current type of n-doped ETL/TMO/HTL CGL is typically not stable enough for practical use. Therefore, approaches that can further improve the stability issue are desirable.

SUMMARY

According to one embodiment, an organic light emitting device is provided comprising a first light emitting unit, a second light emitting unit and a charge generation layer wherein the second light emitting unit is stacked over the first light emitting unit and is connected to the first light emitting unit by means of the charge generation layer and wherein the charge generation layer comprises an electron transport layer, a transition metal oxide layer arranged over the electron transport layer and a diffusion suppressing layer arranged between the electron transport layer and the transition metal oxide layer to separate the electron transport layer from the transition metal oxide layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
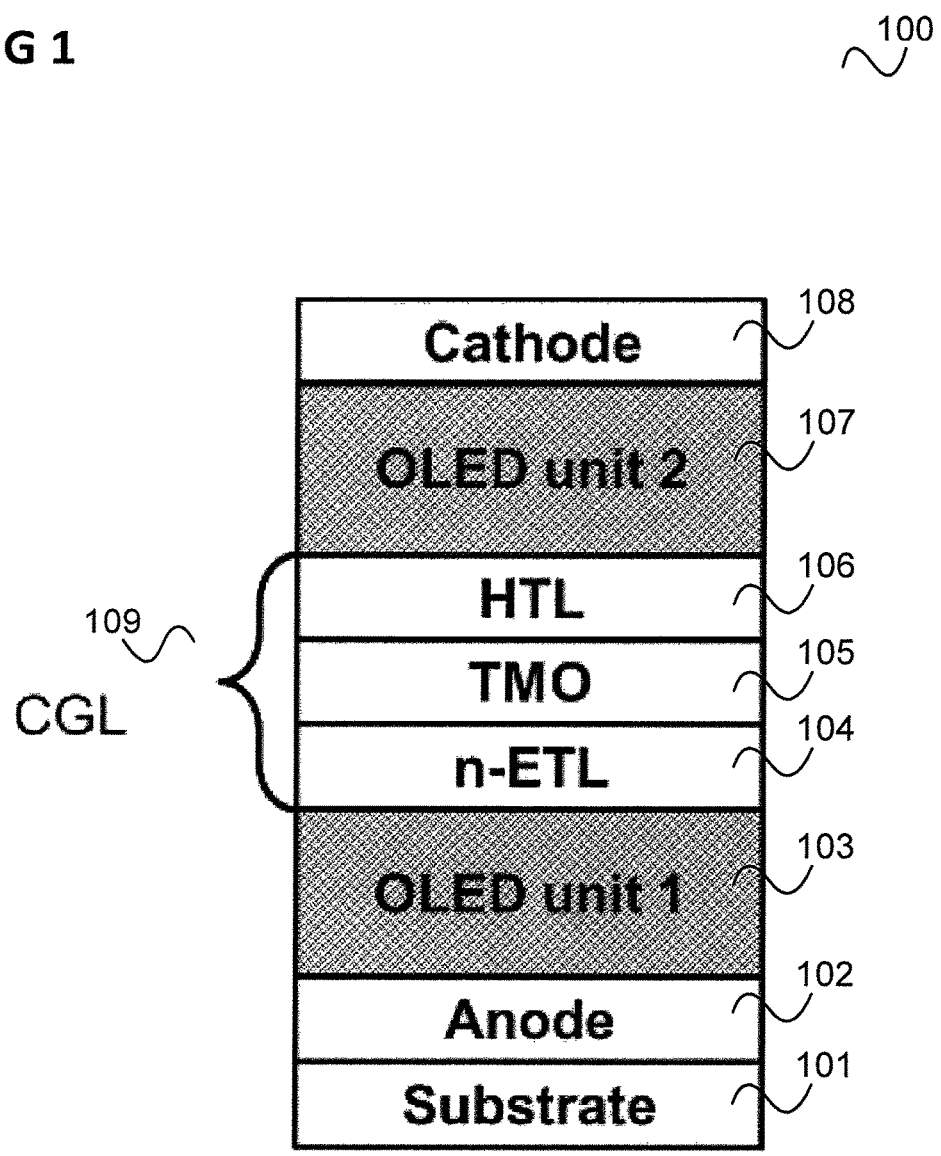
FIG. 1 shows a tandem OLED.

FIG. 1 shows a tandem OLED 100.

The tandem OLED 100 comprises, from bottom to top, a substrate 101, an anode 102, a first OLED (organic light emitting diode) unit 103, an n-ETL (n-doped electron transporting layer) 104, a TMO (transition metal oxide) 105, a hole transporting layer 106, a second OLED 107 and a cathode 108.

The n-ETL 104, the TMO 105 and the HTL 106 form a charge generation layer 109.

It can be shown that a tandem OLED with the structure shown in FIG. 1 is not stable enough for practical use. A structure which may be used for an tandem OLED to provide a higher stability is shown in FIG. 2.

Figure 2:
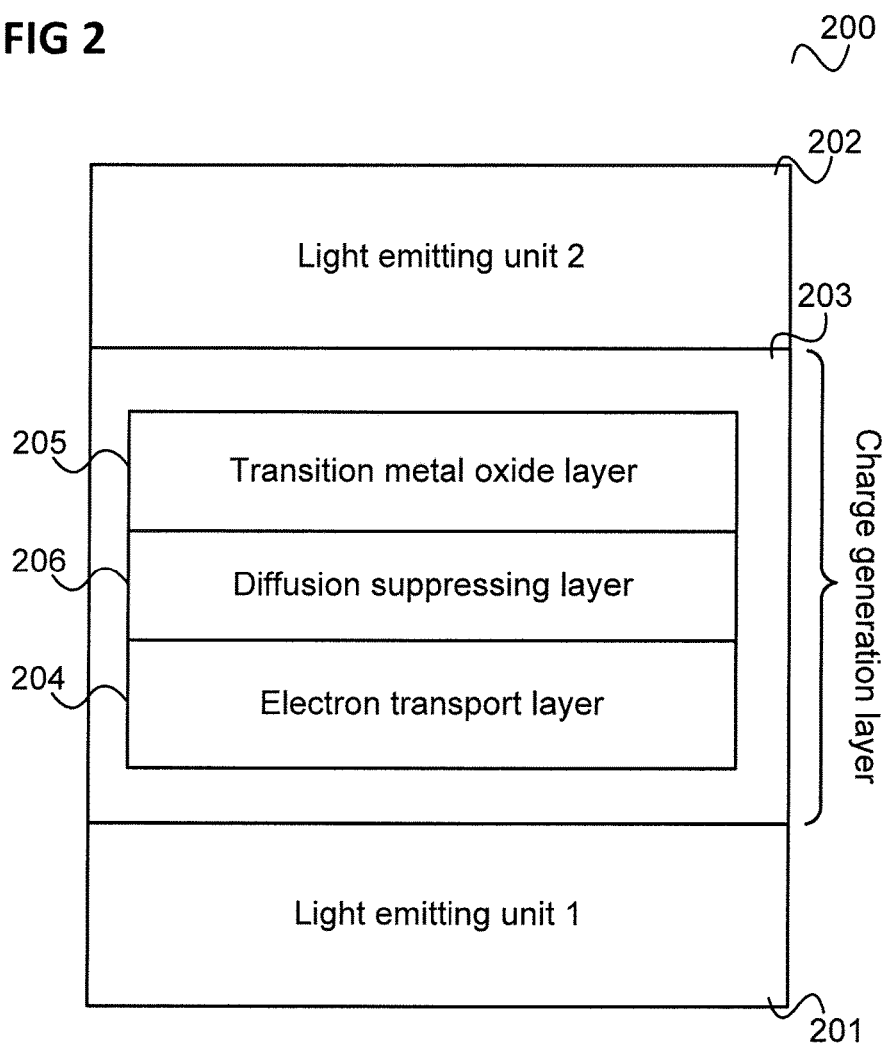
FIG. 2 shows an organic light emitting device.

FIG. 2 shows an organic light emitting device 200.

The organic light emitting device 200 comprises a first light emitting unit 201, a second light emitting unit 202 and a charge generation layer 203.

The second light emitting unit 202 is stacked over the first light emitting unit 201 and is connected to the first light emitting unit 201 by means of the charge generation layer 203.

The charge generation layer 203 comprises an electron transport layer 204, a transition metal oxide layer 205 arranged over the electron transport layer 204 and a diffusion suppressing layer 206 arranged between the electron transport layer 204 and the transition metal oxide layer 205 to separate the electron transport layer 204 from the transition metal oxide layer 205.

In other words, a diffusion barrier is provided between the electron transporting layer and the transition metal oxide layer. The diffusion barrier prevents that TMO material diffuses into the underlying ETL layer and thus reduces interaction between the TMO and the ETL. Since, as can be shown, the diffusion of TMO material into the ETL layer reduces long-term stability, the diffusion layer allows increasing stability of an tandem OLED, e.g. an based on an n-doped ETL/TMO/HTL type CGL as shown in FIG. 1. Besides improving the device stability, at the same time, the driving voltage can be reduced and the power efficiency can be improved with this device structure.

The organic light emitting device 200 may for example be applied in AMOLED (active matrix OLED), PMOLED (passive matrix OLED) displays as pixels or backlight, and also in OLED lighting for both indoor and outdoor areas (such as museum lighting, reading light, decoration light etc.).

According to one embodiment, the charge generation layer further comprises a hole transport layer arranged on the transition metal oxide layer.

The transition metal oxide layer is for example formed of at least one of $MoO_3$ (Molybdenum trioxide), $WO_3$ (Tungsten trioxide), $V_2O_5$ (Vanadium oxide), $Re_2O_3$ (Rhenium oxide) and $Re_2O_7$ (Rhenium (VII) oxide).

The electron transport layer is for example n-doped.

According to one embodiment, the electron transport layer is formed of an organic semiconductor.

The electron transport layer is for example formed of at least one of $Alq_3$ (Tris(8-hydroxyquinolinato)aluminium), Bphen (Bathophenanthroline), BAlq (bis(2-methyl-8-quinolinolato)(4-phenylphenolato)aluminum(III)), TmPyPB (1,3,5-Tri(m-pyrid-3-yl-phenyl)benzene), 3TPYMB (Tris(2,4,6-triMethyl-3-(pyridin-3-yl)phenyl)borane).

According to one embodiment, the diffusion suppressing layer is formed of an organic semiconductor.

The diffusion suppressing layer is for example formed of at least one of C60 (Buckminsterfullerene), C70 (C70 fullerene), NPB (ninhydrin petroleum ether), TCTA (Tris(4-carbazoyl-9-ylphenyl)amine), CBP (4,4'-Bis(N-carbazolyl)-1,1'-biphenyl), CuPc (Copper(II) phthalocyanine), ZnPc (Zinc phthalocyanine).

The organic light emitting device for example further comprises an anode below the first light emitting unit connected to the first light emitting unit.

For example, the organic light emitting further comprises a substrate, wherein the anode is arranged on the substrate.

The organic light emitting device may further comprise a cathode above the second light emitting unit connected to the second light emitting unit.

According to one embodiment, the organic light emitting device comprises three or more light emitting units stacked over one another to form a stack of light emitting units, wherein each light emitting unit is connected to an adjacent subsequent light emitting unit in the stack by means of a charge generation layer, wherein each charge generation layer comprises an electron transport layer, a transition metal oxide layer arranged over the electron transport layer and a diffusion suppressing layer arranged between the electron transport layer and the transition metal oxide layer to separate the electron transport layer from the transition metal oxide layer.

The first light emitting unit and the second light emitting unit may be organic light emitting diode (OLED) units.

In the following, embodiments are described in more detail.

Figure 3:
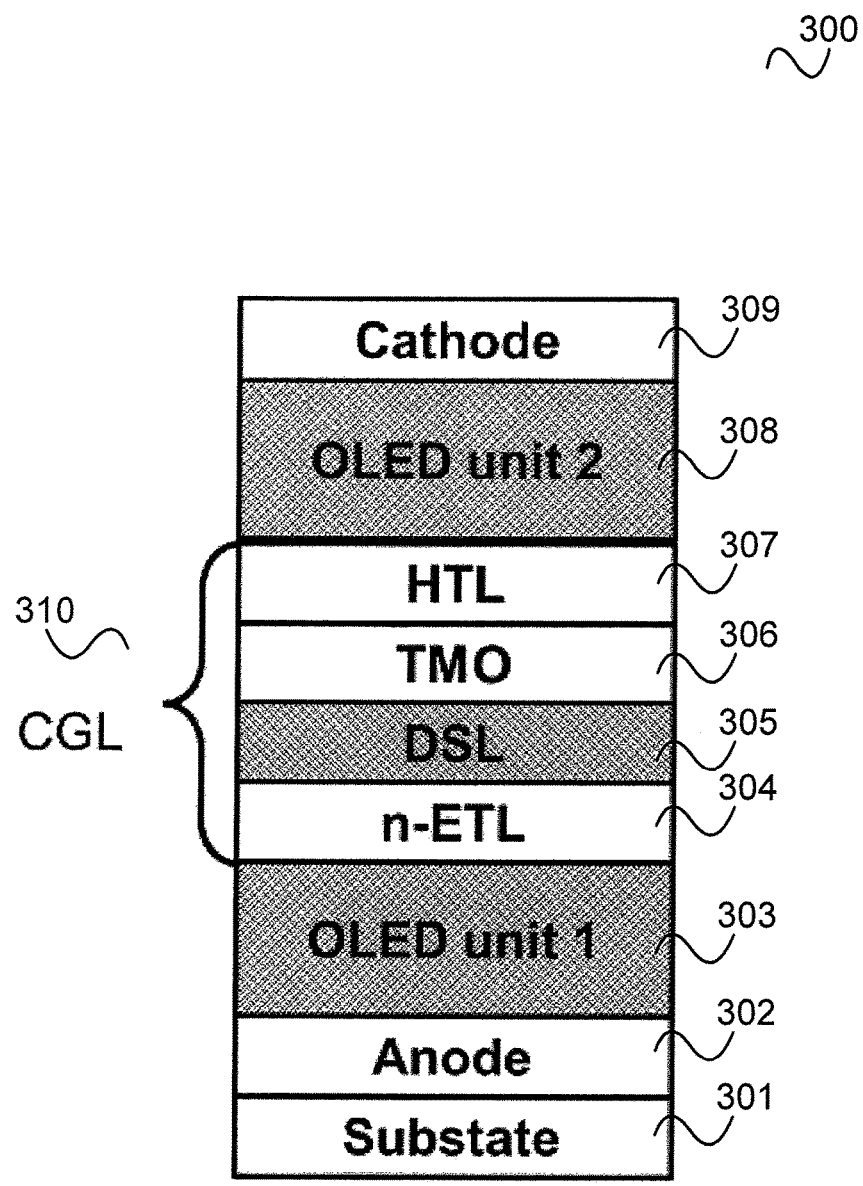
FIG. 3 shows a tandem OLED.

FIG. 3 shows a tandem OLED 300.

The tandem OLED 300 comprises, from bottom to top, a substrate 301, an anode 302, a first OLED (organic light emitting diode) unit 303, an n-ETL (n-doped electron transporting layer) 304, a diffusion suppressing layer (DSL) 305, a TMO (transition metal oxide) 306, a hole transporting layer 307, a second OLED 308 and a cathode 309. The n-ETL 304, the DSL 305, the TMO 306 and the HTL 307 form a charge generation layer 310.

Compared with the tandem OLED 100 of FIG. 1, the DSL 305 is introduced between the n-doped ETL 304 and TMO layer 306 in the tandem OLED 300.

Regarding the materials of the various layers 301 to 309, for example,
1) The substrate 301 can be glass, PET, paper, etc.
2) The anode 302 can be ITO (indium tin oxide), PEDOT:PSS (poly(3,4-ethylenedioxythiophene) polystyrene sulfonate), metal, metal nanowire networks, etc.
3) The OLED units 303, 308 can be the same or different for different application. A general structure for them is hole injection layer, hole transport layer, electron blocking layer, emissive layer, hole blocking layer, electron transport layer, electron injection layer. These functional layers can be neglected in some applications.
4) The n-ETL 304 is composed of an electron transporting material that doped with an n-type dopant. The electron transporting material can be any organic semiconductor that can transport electrons, such as $Alq_3$, Bphen, BAlq, TmPyPB, 3TPYMB, etc. The n-type dopant can be low workfunction metals or their oxide, azide and carbonate, such as Li (Lithium), Cs (Caesium), Mg (Manganese), $Li_2O$ (Lithium oxide), $Cs_2CO_3$ (Caesum carbonate), $CsN_3$ (Caesium azide), $Li_2CO_3$ (Lithium carbonate) etc.
5) The TMO 306 can be transition metal oxides, such as $MoO_3$, $WO_3$, $V_2O_5$, $Re_2O_3$, $Re_2O_7$, etc.
6) The HTL 307 can be any organic semiconductor that can transport holes, such as NPB, TCTA, CBP, TPD, Pentacene, CuPc, ZnPc, TAPC (4,4'-Cyclohexylidenebis[N,N-bis(4-methylphenyl)benzenamine]), etc.
7) The DSL 305 can be any organic semiconductors, including but not restrict to C60, C70, NPB, TCTA, CBP, CuPc, ZnPc, etc.
8) For the above-mentioned layers, except the ITO and glass substrate, all of them may be processed by thermal evaporation under vacuum conditions.

It should be noted that the device can contain several CGLs to build multiple stacked tandem OLEDs.

For the further explanation, in the following, a comparison is given between a single OLED and a normal tandem OLED based on n-doped ETL/TMO/HTL-type CGL without diffusion suppression layer.

Figure 4:
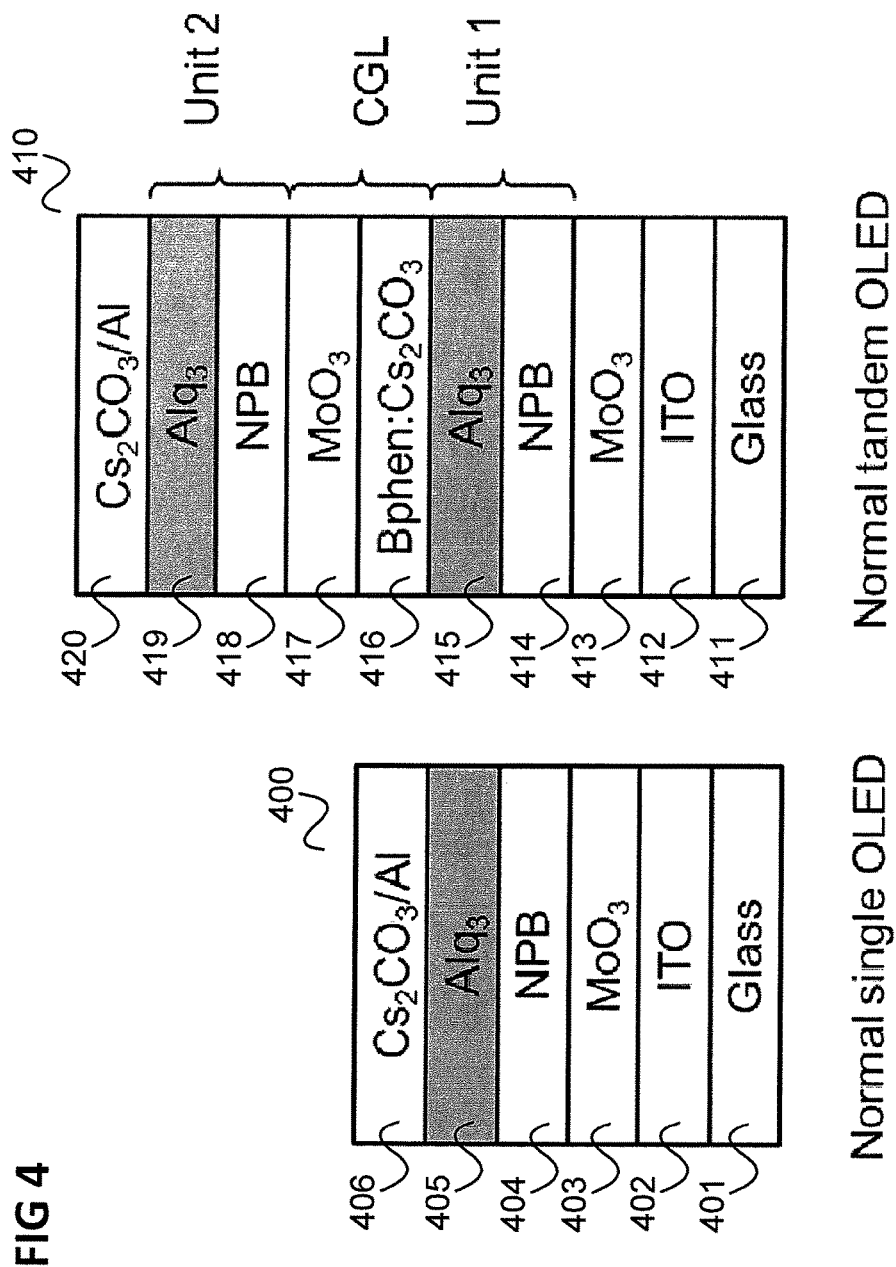
FIG. 4 shows a single OLED and a tandem OLED.

FIG. 4 shows a single OLED 400 and a tandem OLED 410.

The OLED 400 comprises, from bottom to top, a glass substrate 401, an ITO layer 402, a $MoO_3$ layer 403 (2 nm), an NPB layer 404 (80 nm), an $Alq_3$ layer 405 (60 nm) and an $Cs_2CO_3$ (1 nm)/Al layer 406.

The tandem OLED 410 comprises, from bottom to top, a glass substrate 411, an ITO layer 412, an $MoO_3$ layer 413 (2 nm), a first NPB layer 414 (80 nm), a first $Alq_3$ layer 415 (60 nm) and Bphen:30 wt. % $Cs_2CO_3$ layer 416, an $MoO_3$ layer 417 (10 nm), a second NPB layer 418 (80 nm), a second $Alq_3$ layer 419 (60 nm) and an $Cs_2CO_3$ (1 nm)/Al (150 nm) layer 420. The first NPB layer 414 and the first $Alq_3$ layer 415 form a first OLED unit and the second NPB layer 418 and the second $Alq_3$ layer 419 form a second OLED unit. The Bphen:30 wt. % $Cs_2CO_3$ layer 416, the $MoO_3$ layer 417 and the second NPB layer 418 can be seen to form an n-doped ETL/TMO/HTL-type CGL.

Figure 5:
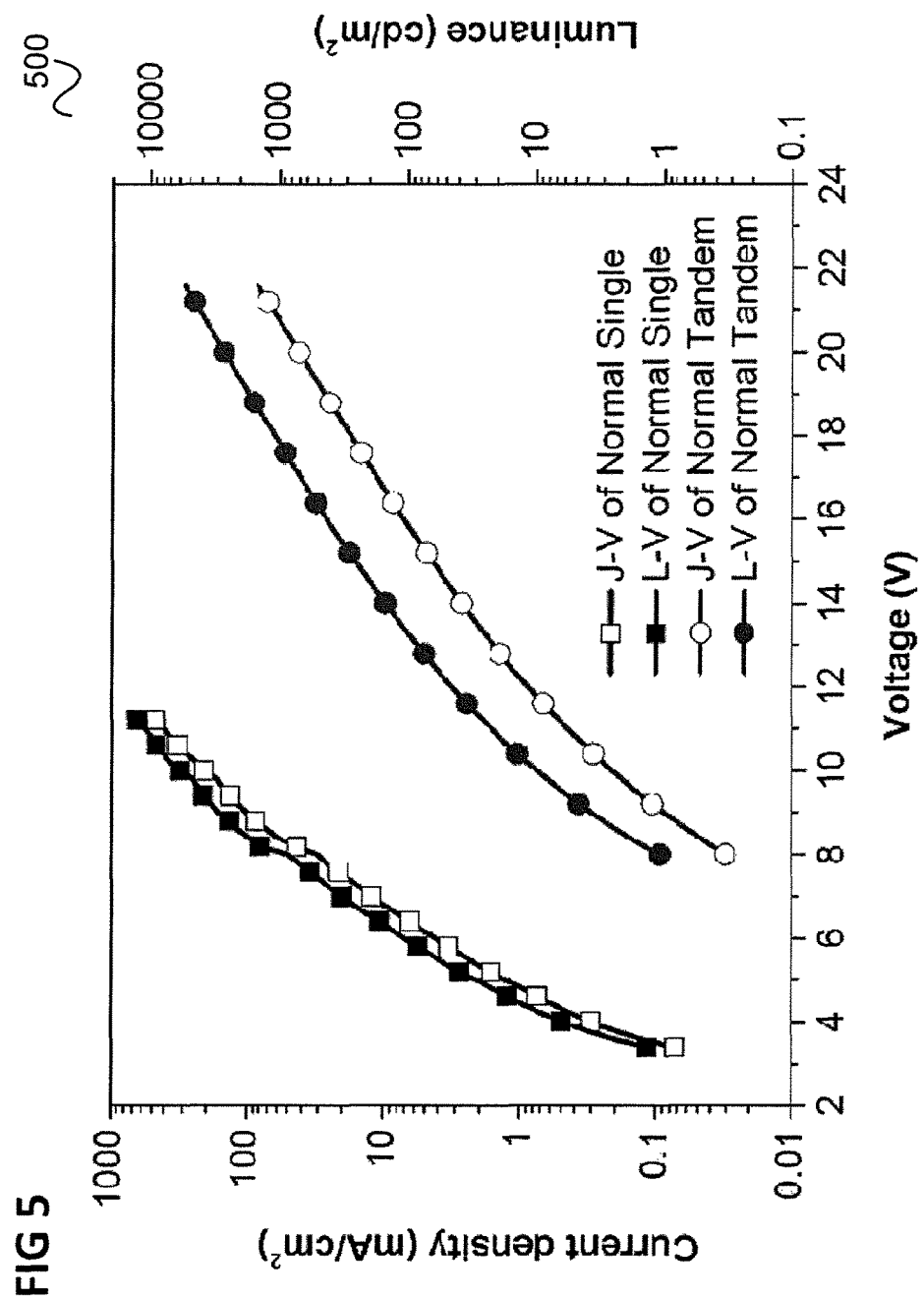
FIG. 5 shows a diagram showing J (current density)-V (voltage) and L (luminance)-V curves for the single OLED and the tandem OLED of FIG. 4.

FIG. 5 shows a diagram 500 showing J (current density)-V (voltage) and L (luminance)-V (voltage) curves for the single OLED and the tandem OLED of FIG. 4.

Figure 6:
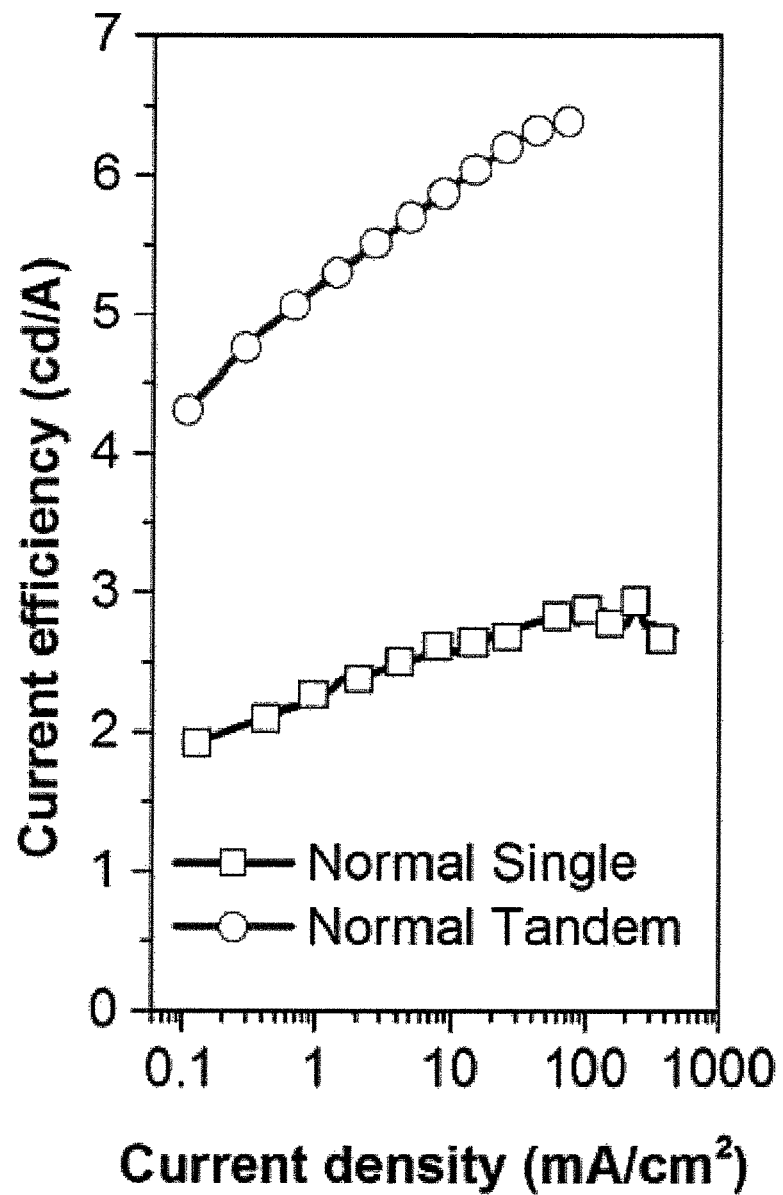
FIG. 6 shows a diagram showing current efficiency vs. current density curves for the single OLED and the tandem OLED of FIG. 4.

FIG. 6 shows a diagram 600 showing current efficiency vs. current density curves for the single OLED and the tandem OLED of FIG. 4.

Figure 7:
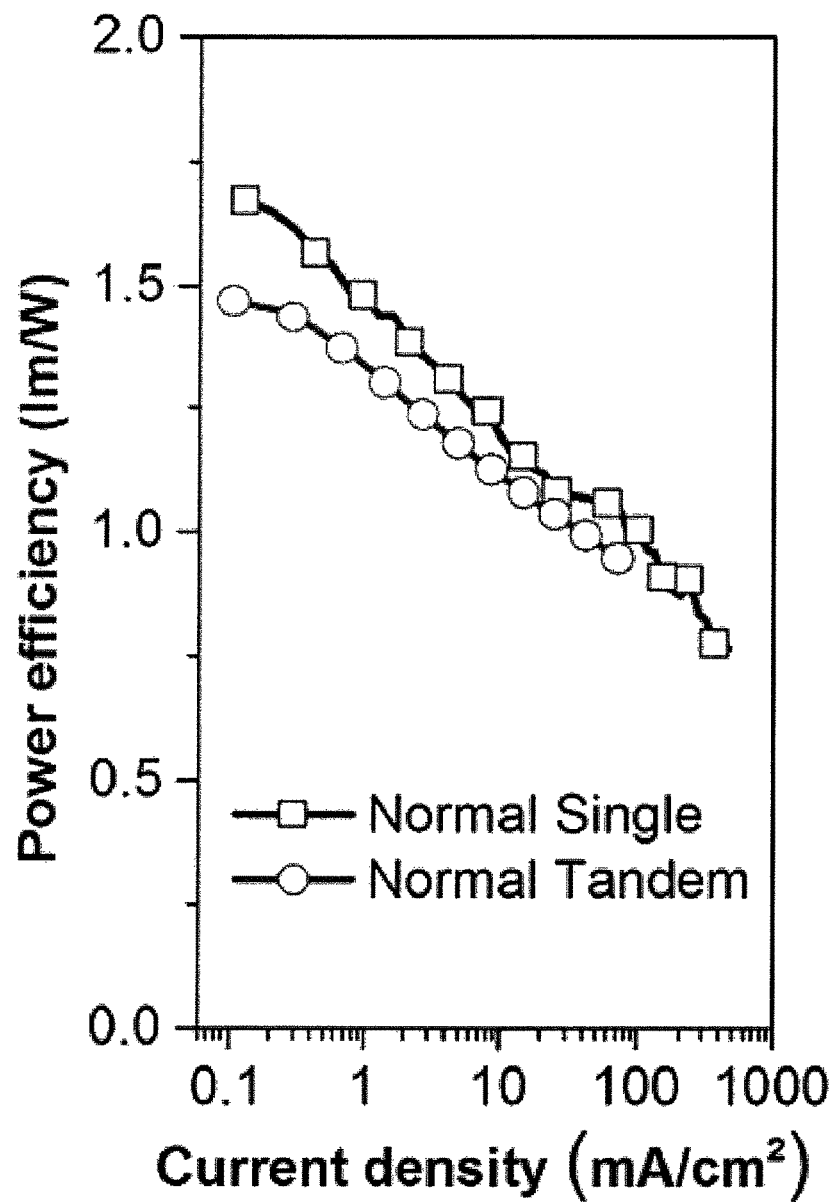
FIG. 7 shows a diagram showing power efficiency vs. current density curves for the single OLED and the tandem OLED of FIG. 4.

FIG. 7 shows a diagram 700 showing power efficiency vs. current density curves for the single OLED and the tandem OLED of FIG. 4.

Figure 8:
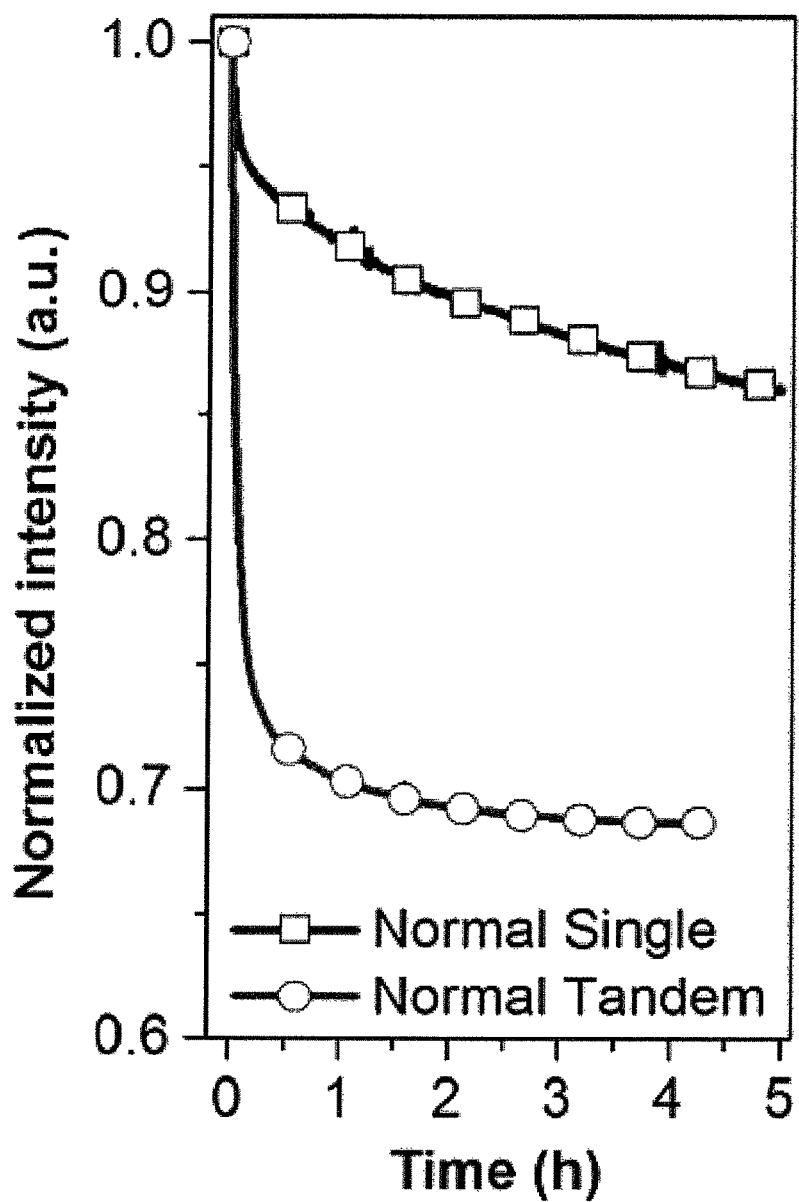
FIG. 8 shows a diagram showing luminance for the single OLED and the tandem OLED of FIG. 4.

FIG. 8 shows a diagram 800 showing luminance for the single OLED and the tandem OLED of FIG. 4.

Figure 9:
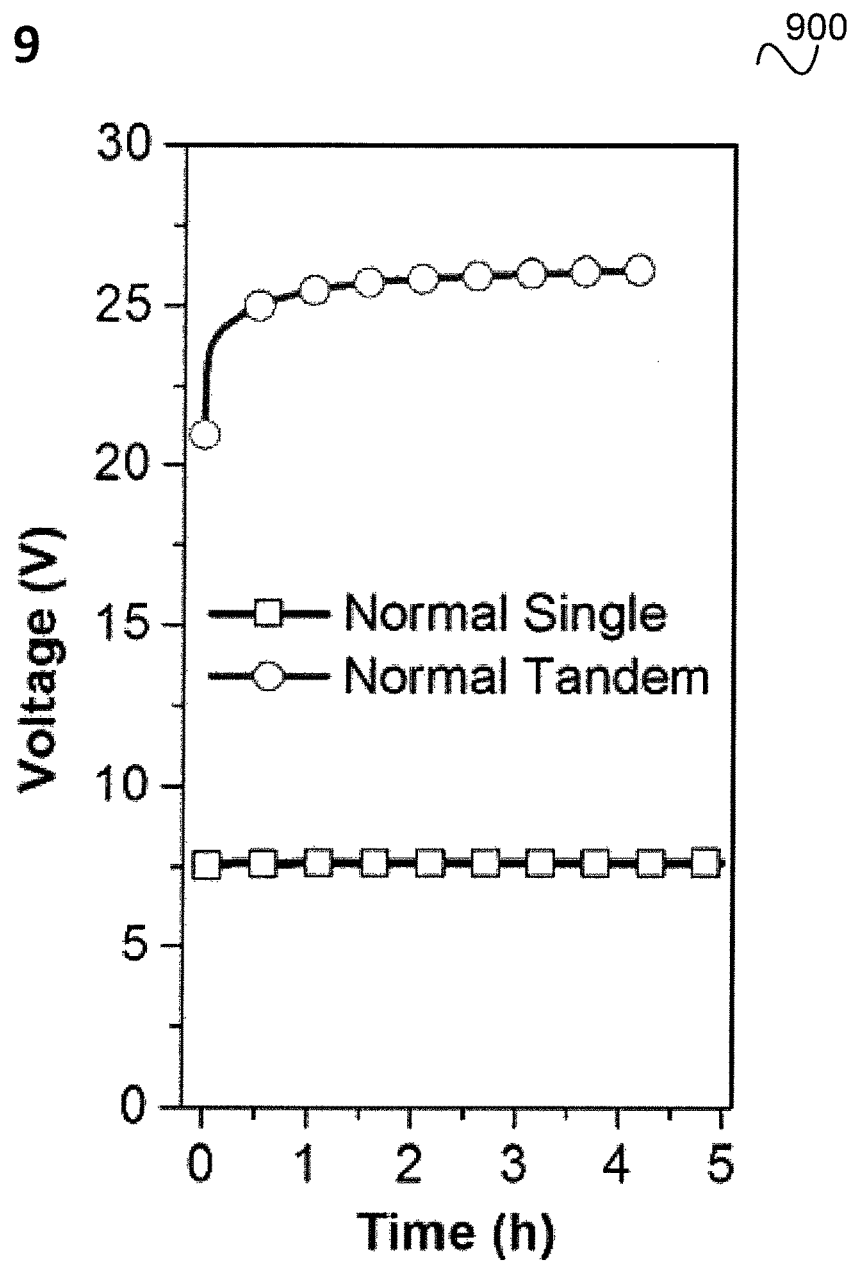
FIG. 9 shows a diagram showing voltage degradation curves for the single OLED and the tandem OLED of FIG. 4.

FIG. 9 shows a diagram 900 showing voltage degradation curves for the single OLED and the tandem OLED of FIG. 4.

It can be seen that compared with the single OLED 401, the tandem OLED 410 needs a voltage that is a little more than double of the normal single OLED to achieve the same current density (see FIG. 5), the current efficiency of the normal tandem OLED is more than double of the normal single OLED (see FIG. 6) and the power efficiency of the normal tandem OLED is a little lower than that of the normal single OLED (see FIG. 7). All these indicate the Bphen:$Cs_2CO_3$/$MoO_3$/NPB is an effective CGL.

However, the long-term stabilities of the two OLEDs 401, 410 are surprisingly quite different. As shown in FIG. 8, at a constant driving current density of 50 mA/cm$^2$, the luminance of the normal tandem OLED drops to 70% of its initial luminance within 3 h, where it is about 87% for the normal single OLED. At the same time, as shown in FIG. 9, the driving voltage of the normal tandem OLED increases rapidly from 20.5 V to more than 25 V, with a increment of more than 20%, where it is marginal for the normal single OLED.

By comparing the structures of the single and normal tandem OLEDs 401, 410, it can be seen that the CGL should be responsible for the poor operational stability of the tandem OLED 410. Individually, the three components of the CGL, i.e. Bphen:$Cs_2CO_3$, $MoO_3$ and NPB, should be stable enough due to the fact that OLEDs with them as ETL, hole injection layer or hole transporting layer show good long term stability. Thus the interfaces in the CGL, Bphen:$Cs_2CO_3$/$MoO_3$ and $MoO_3$/NPB are to be considered. As the combination of $MoO_3$/NPB has been applied in OLEDs for a few years and it can greatly improve the stability of the resulted OLEDs, the uncertainty lies in the interface between the Bphen:$Cs_2CO_3$ layer 416 and the $MoO_3$ layer 417. The Cs cations migration during the electrical stressing of the tandem OLED might be a possible cause for the interface degradation, however, there is no direct evidence for this assumption. And if this is true, similar Cs cations migration process should happen in inverted tandem OLED with the same CGL.

Figure 10:
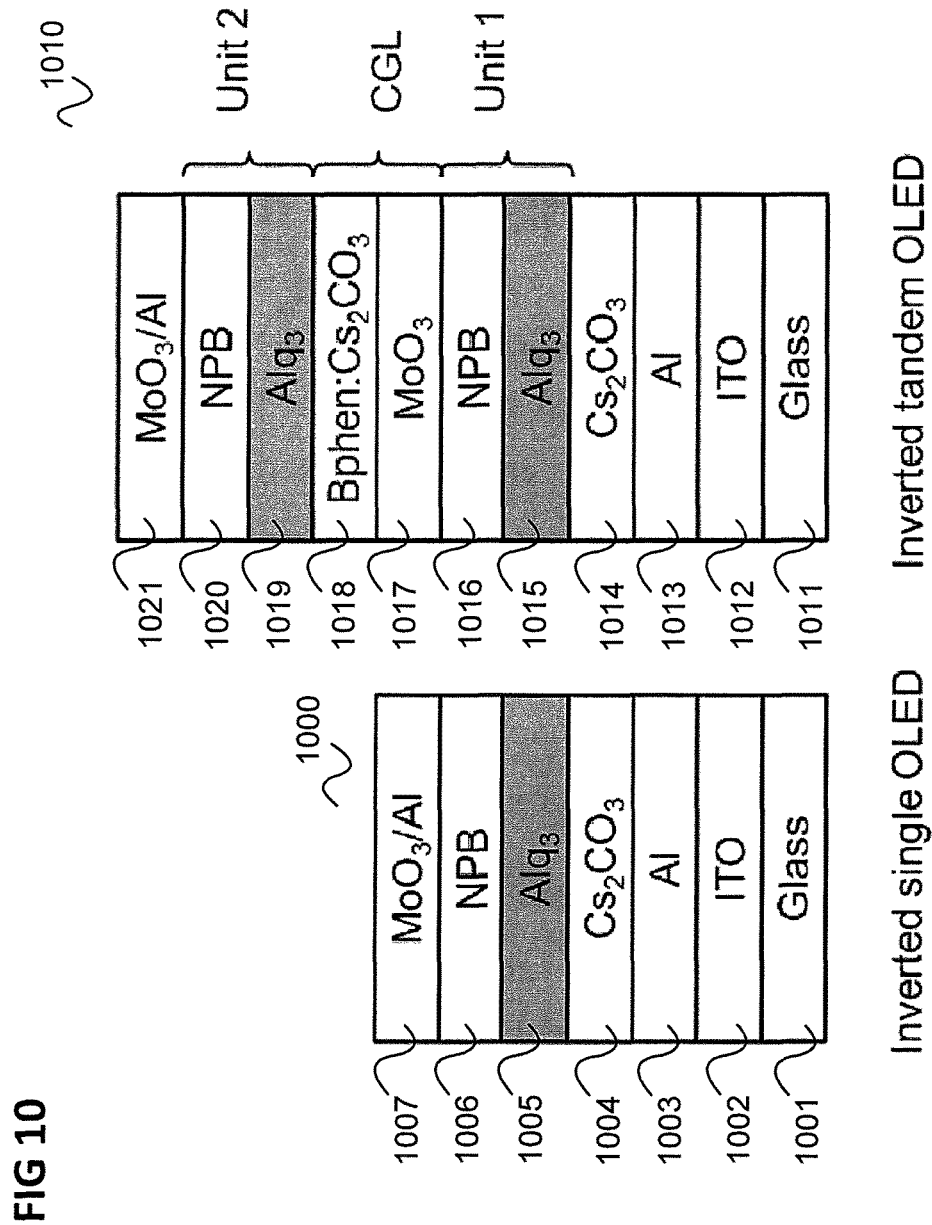
FIG. 10 shows an inverted single OLED and an inverted tandem OLED.

To examine this, two inverted OLEDs, termed as inverted single OLED and inverted tandem OLED may be considered as illustrated in FIG. 10.

FIG. 10 shows an inverted single OLED 1000 and an inverted tandem OLED 1010.

The inverted OLED 1000 comprises, from bottom to top, a glass substrate 1001, an ITO layer 1002, an Al layer 1003 (1 nm), a $Cs_2CO_3$ layer (1 nm) 1004, an $Alq_3$ layer 1005 (80 nm), an NPB layer (60 nm) 1006 and an $MoO_3$ (5 nm)/Al (150 nm) layer 1007.

The inverted tandem OLED 1010 comprises, from bottom to top, a glass substrate 1011, an ITO layer 1012, an Al layer 1013 (1 nm), an $Cs_2CO_3$ layer (1 nm) 1014, an $Alq_3$ layer 1015 (80 nm), an NPB layer 1016 (60 nm), an $MoO_3$ layer (10 nm) 1017, an Bphen:30 wt. % $Cs_2CO_3$ layer 1018, an $Alq_3$ layer 1019 (80 nm), an NPB layer 1020 (60 nm) and an $MoO_3$ (5 nm)/Al (150 nm) layer 1021.

Figure 11:
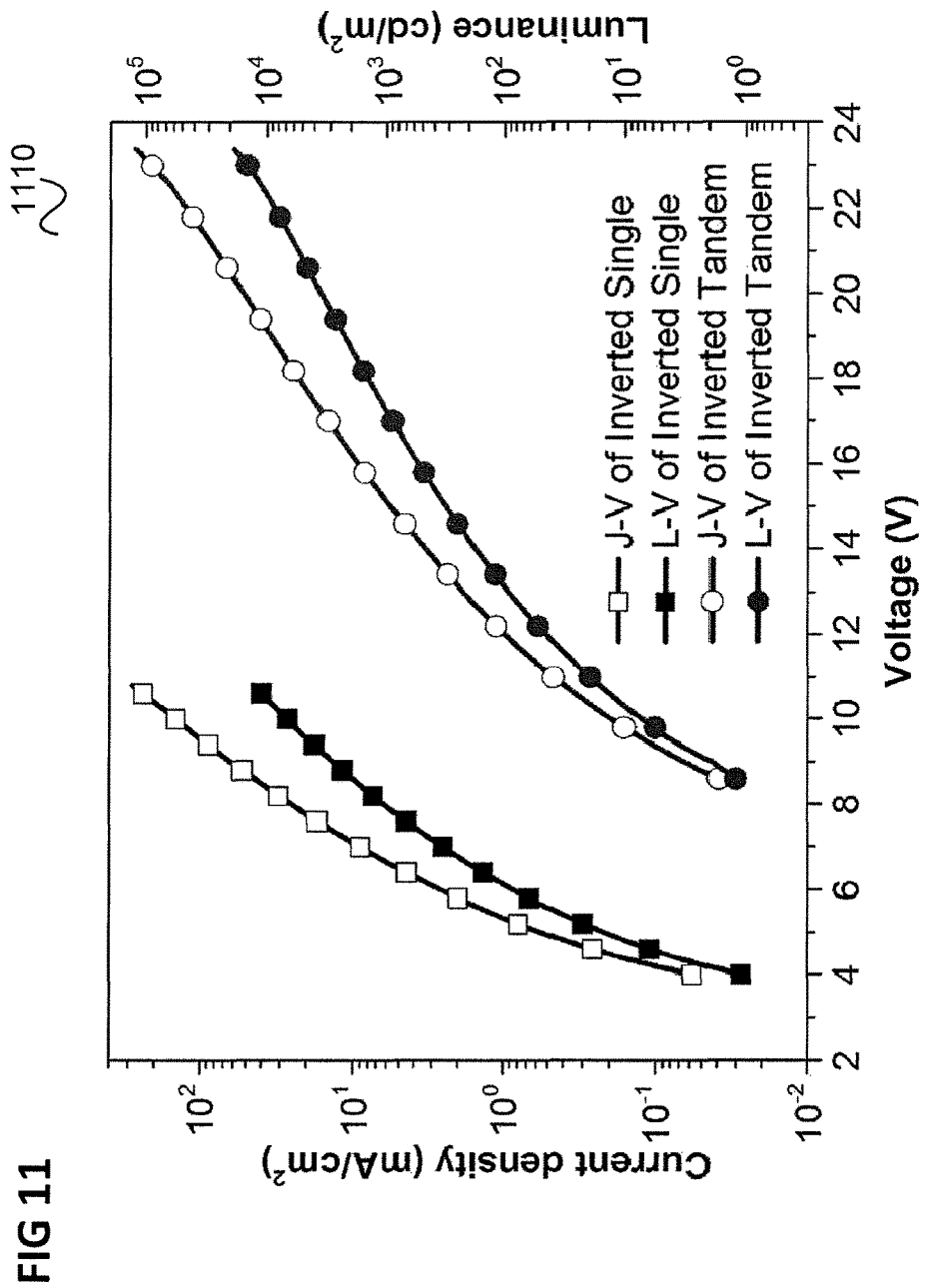
FIG. 11 shows a diagram showing J-V and L-V curves for the single OLED and the tandem OLED of FIG. 10.

FIG. 11 shows a diagram 1100 showing J (current density)-V (voltage) and L (luminance)-V (voltage) curves for the single OLED and the tandem OLED of FIG. 10.

Figure 12:
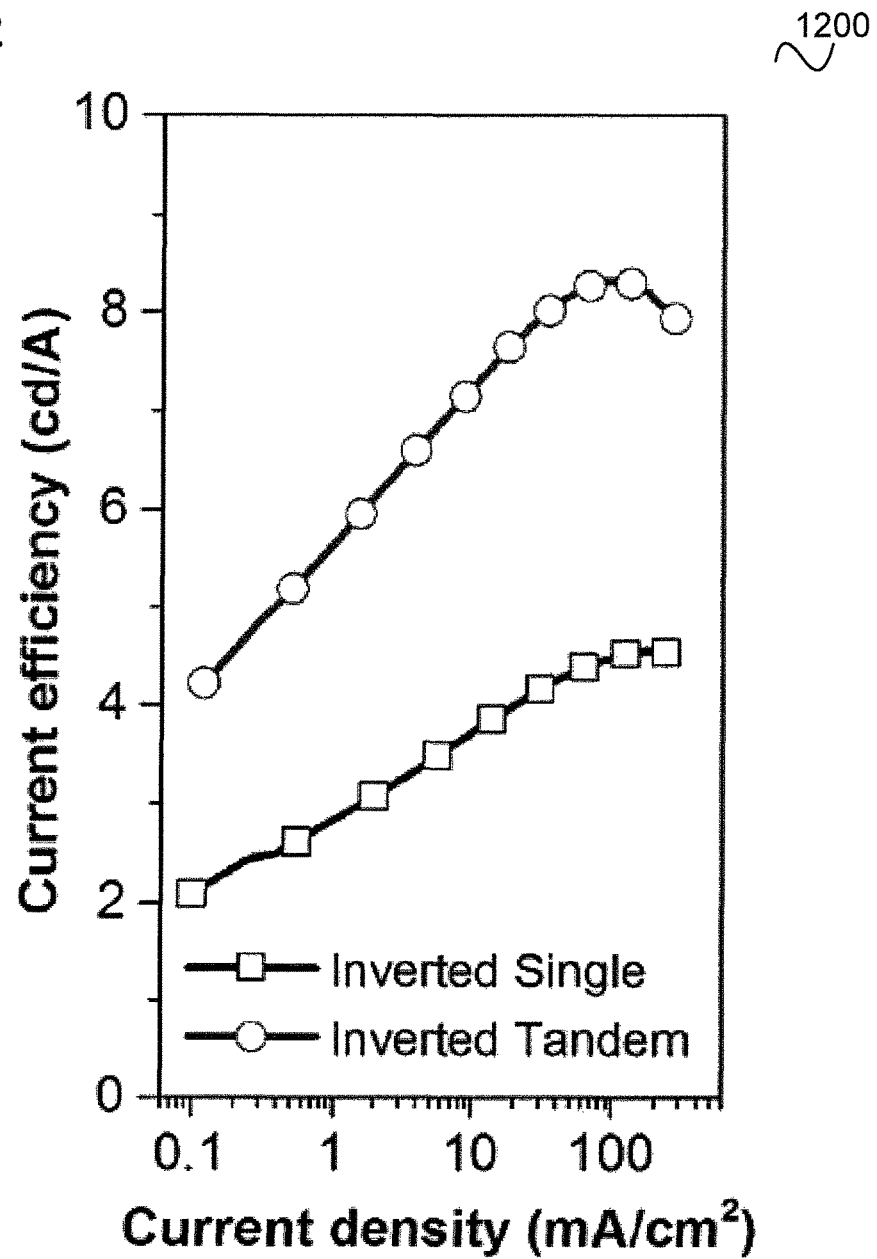
FIG. 12 shows a diagram showing current efficiency vs. current density curves for the single OLED and the tandem OLED of FIG. 10.

FIG. 12 shows a diagram 1200 showing current efficiency vs. current density curves for the single OLED and the tandem OLED of FIG. 10.

Figure 13:
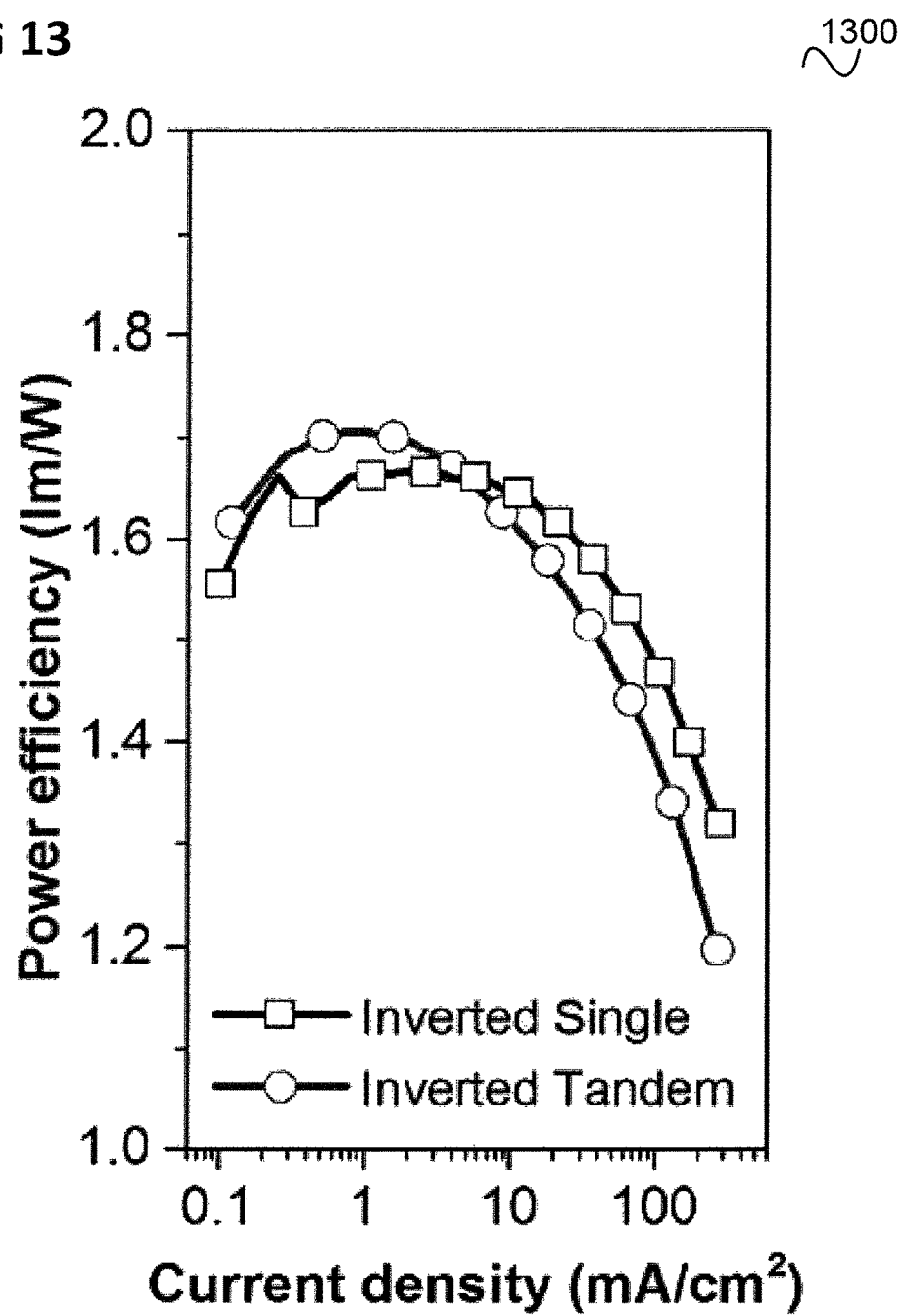
FIG. 13 shows a diagram showing power efficiency vs. current density curves for the single OLED and the tandem OLED of FIG. 10.

FIG. 13 shows a diagram 1300 showing power efficiency vs. current density curves for the single OLED and the tandem OLED of FIG. 10.

Figure 14:
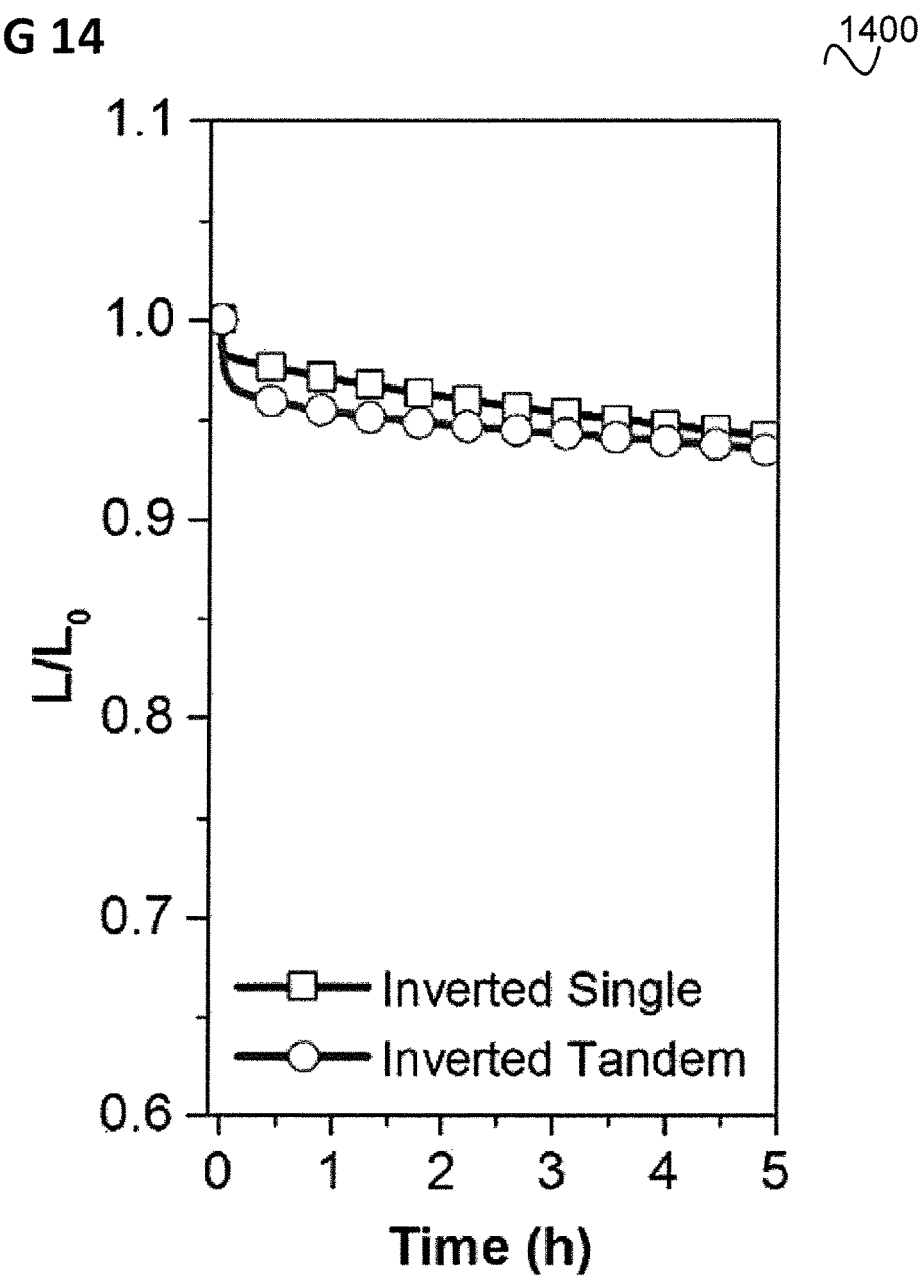
FIG. 14 shows a diagram showing luminance for the single OLED and the tandem OLED of FIG. 10.

FIG. 14 shows a diagram 1400 showing luminance for the single OLED and the tandem OLED of FIG. 10.

Figure 15:
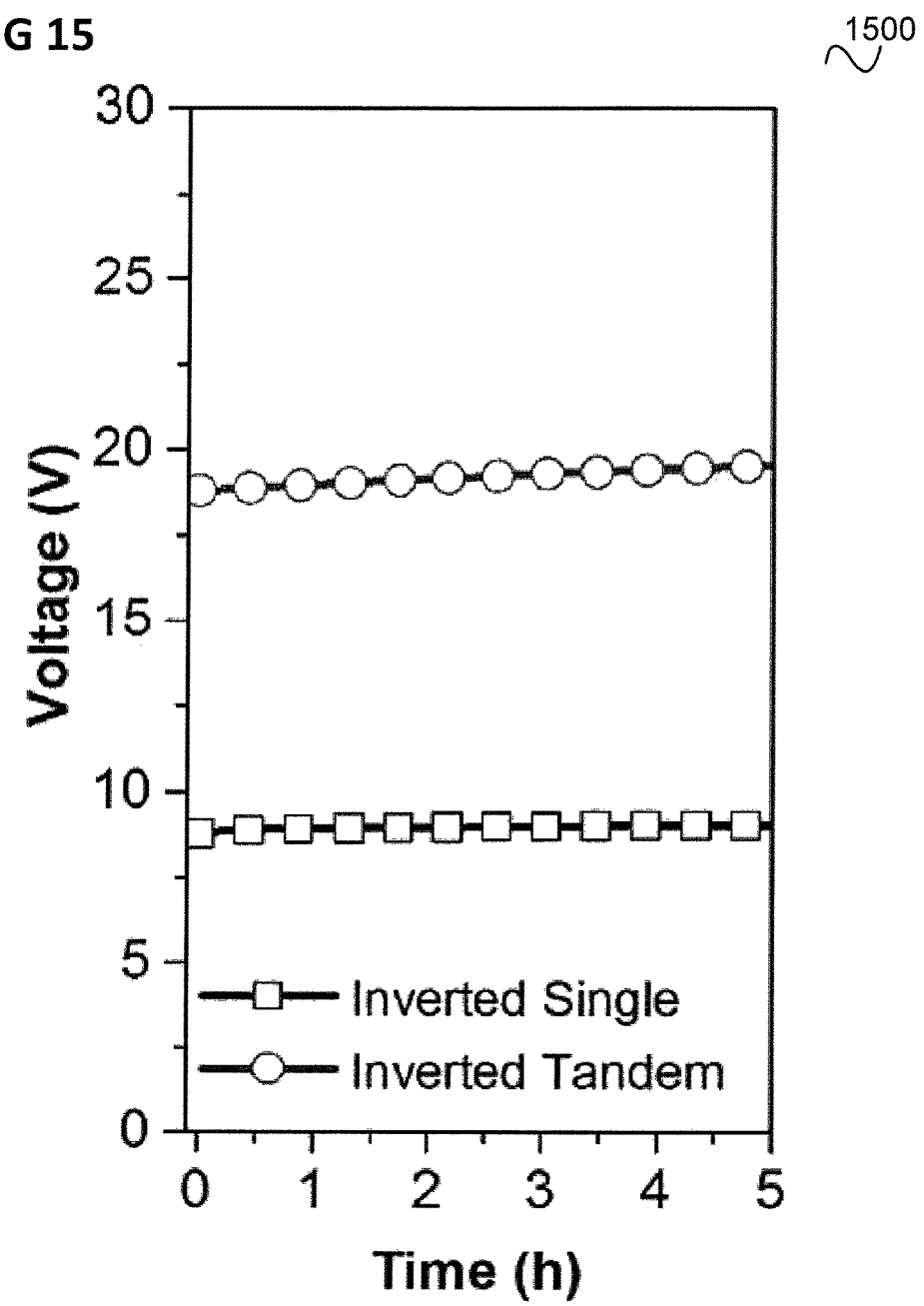
FIG. 15 shows a diagram showing voltage degradation curves for the single OLED and the tandem OLED of FIG. 10.

FIG. 15 shows a diagram 1500 showing voltage degradation curves for the single OLED and the tandem OLED of FIG. 10.

From FIGS. 11, 12 and 13, it can be seen that both the driving voltage and current efficiency for the inverted tandem OLED at the same current density are about two times of the inverted reference single OLED and the power efficiency of the two OLEDs are almost the same, which indicates the reverse stack of NPB/MoO$_3$/Bphen:Cs$_2$CO$_3$ CGL can work normally. However, opposite to the case for the normal single and normal tandem OLEDs, as shown in FIGS. 14 and 15, the long-term stability of the two inverted OLEDs is quite similar. From FIG. 14 it can be seen that the luminance degradation processes for the two inverted OLEDs are almost following the same trend. And in FIG. 15, the voltage degradations for both are marginal. This indicates the degradation mechanism in the normal tandem OLED does not exist or is not so obvious in the inverted tandem OLED. This also means that the Cs cations migration should not be the reason for the degradation in the normal tandem OLED.

It can be shown that when TMO is deposited onto an organic semiconductor thin film, the TMO diffuses into the organic thin film and the diffusion depth is depending on the property of the organic semiconductor. For example, depositing MoO$_3$ onto an CBP thin film, the MoO$_3$ can diffuse more than 20 nm into the CBP layer. This process may also happen in an tandem OLED as illustrated in FIG. 16.

Figure 16:
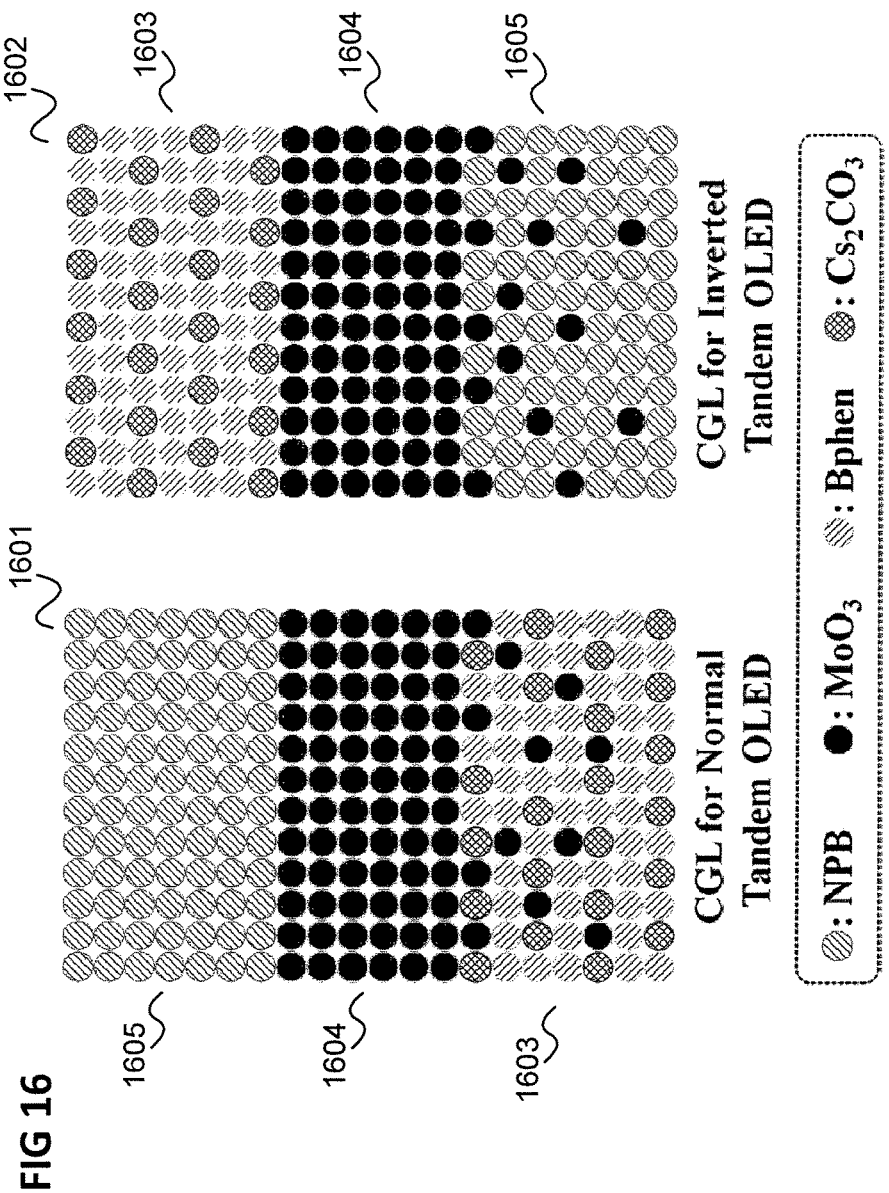
FIG. 16 illustrates the charge generation layer for a normal (i.e. non-inverted) tandem OLED and the charge generation layer for an inverted tandem OLED.

FIG. 16 illustrates the charge generation layer 1601 for a normal (i.e. non-inverted) tandem OLED and the charge generation layer 1602 for an inverted tandem OLED.

The charge generation layers 1601, 1602 each comprise a Bphen:Cs$_2$CO$_3$ layer 1603, an MoO$_3$ layer 1604 and an NPB layer 1605.

By comparing the structures of the charge generation layers 1601, 1602 of the two tandem OLEDs, it can be seen that in the normal tandem OLED, MoO$_3$ may diffuse into the Bphen:Cs$_2$CO$_3$ layer 1604 while in the inverted tandem OLED this does not happen. So, this difference may cause the different long term stabilities of the two tandem OLEDs. Thus, by suppressing the MoO$_3$ diffusion into the Bphen:Cs$_2$CO$_3$ layer 1604, principally, the long term stability of the normal tandem OLED can be improved.

Figure 17:
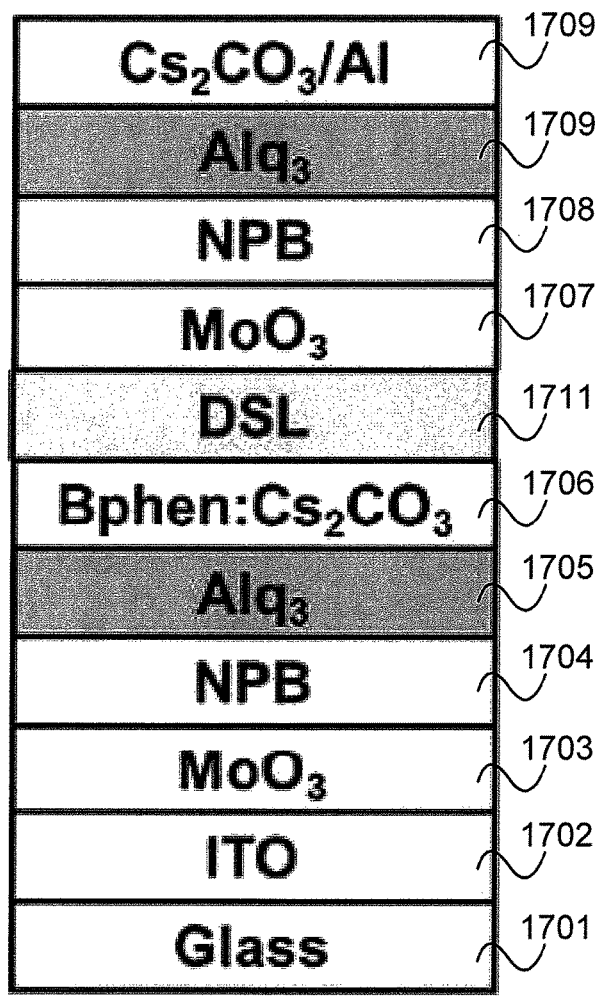
FIG. 17 shows a normal (i.e. non-inverted) tandem OLED with a diffusion stopping layer.

FIG. 17 shows a normal (i.e. non-inverted) tandem OLED 1700 with a diffusion stopping layer.

Similarly to the tandem OLED 410 of FIG. 4, the tandem OLED 1700 comprises, from bottom to top, a glass substrate 1701, an ITO layer 1702, an MoO$_3$ layer 1703 (2 nm), a first NPB layer 1704 (80 nm), a first Alq$_3$ layer 1705 (60 nm) and Bphen:30 wt. % Cs$_2$CO$_3$ layer 1706, an MoO$_3$ layer 1707 (10 nm), a second NPB layer 1708 (80 nm), a second Alq$_3$ layer 1709 (60 nm) and an Cs$_2$CO$_3$ (1 nm)/Al (150 nm) layer 1710. However, in contrast to the tandem OLED 410 of FIG. 4, the tandem OLED 1700 comprises an additional diffusion stopping layer (DSL) 1711 between the Bphen:Cs$_2$CO$_3$ layer 1706 and the MoO$_3$ 1707 layer.

FIGS. 18 to 22 show results for a moderate thickness of 5 nm for the DSL for four organic semiconductors for the DSL for comparison: NPB, Alq$_3$, Bphen and C60. These four materials have different energy levels and thermal properties.

Figure 18:
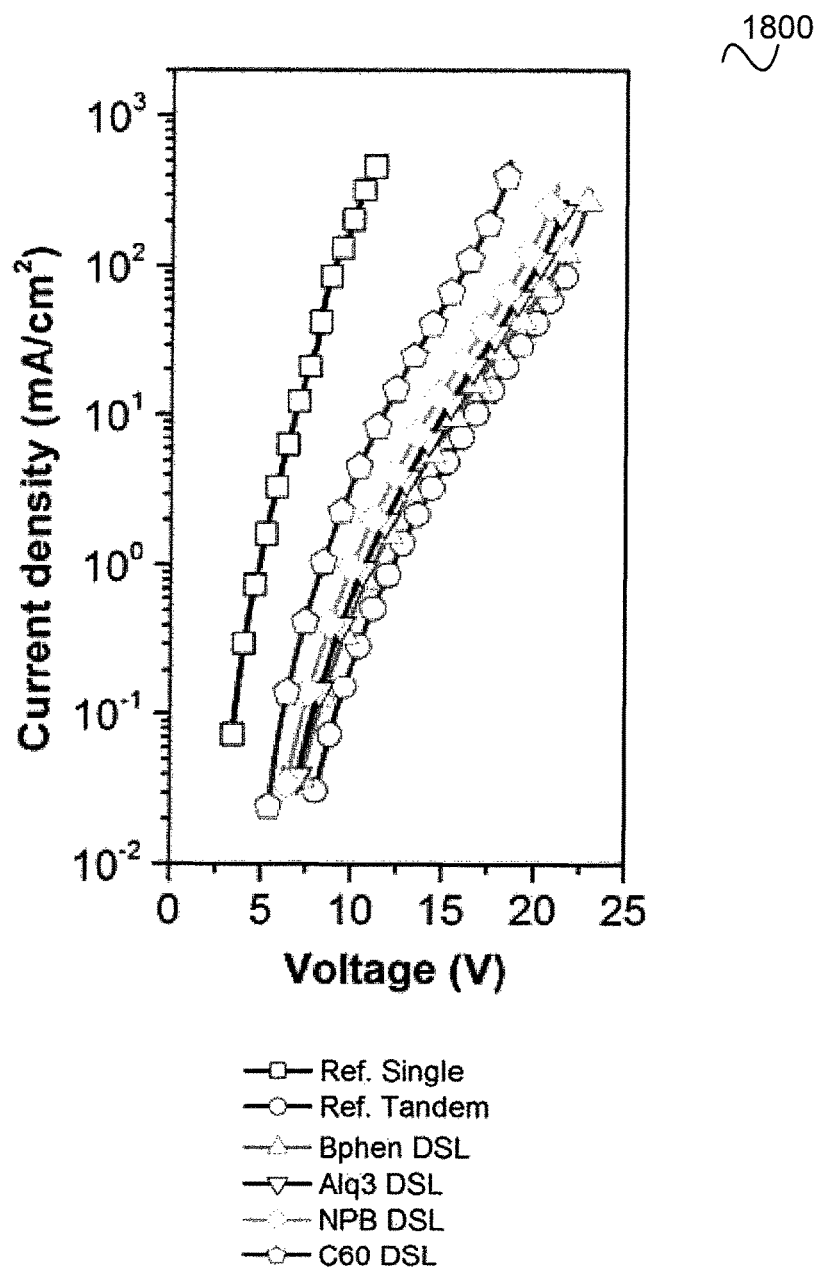
FIG. 18 shows a diagram showing J-V curves for the tandem OLED for different diffusion layer materials.

FIG. 18 shows a diagram 1800 showing J (current density)-V (voltage) curves for the tandem OLED 1700 for the different diffusion layer materials.

Figure 19:
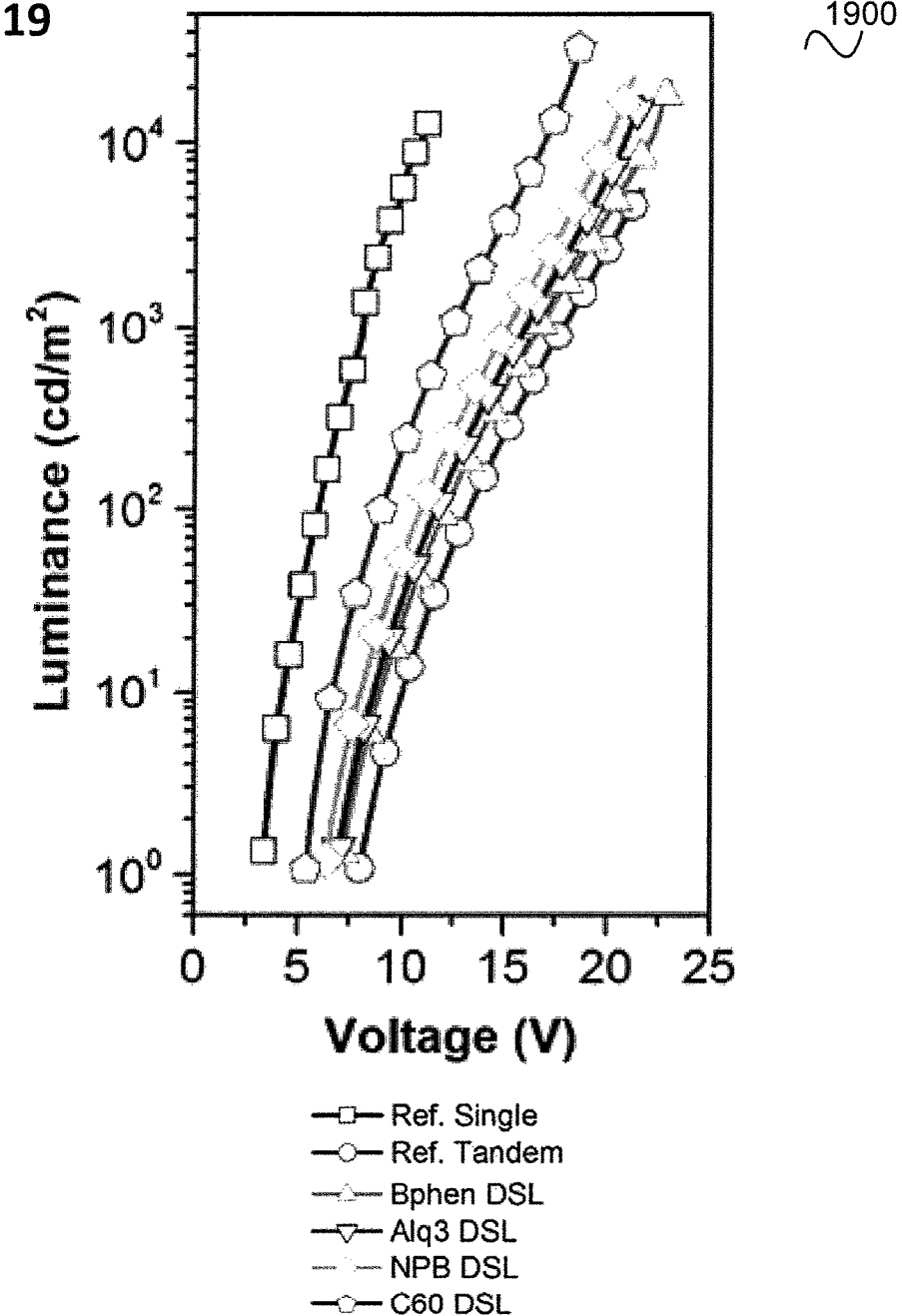
FIG. 19 shows a diagram showing L-V curves for the tandem OLED for different diffusion layer materials.

FIG. 19 shows a diagram 1900 showing L (luminance)-V curves for the tandem OLED 1700 for the different diffusion layer materials.

Figure 20:
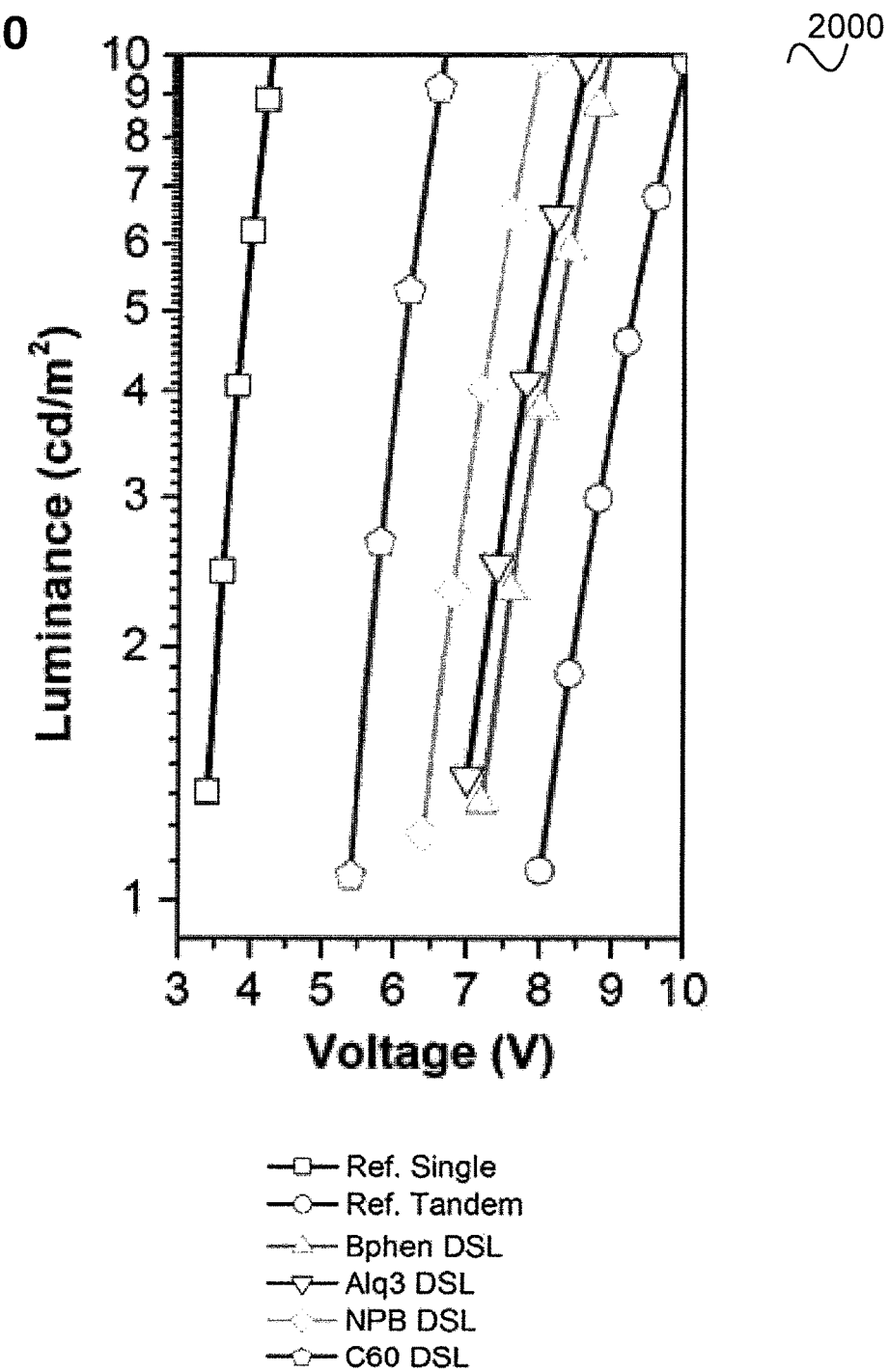
FIG. 20 shows a diagram showing zoomed out L-V curves for the tandem OLED for different diffusion layer materials.

FIG. 20 shows a diagram 2000 showing zoomed out L-V curves for the tandem OLED 1700 for the different diffusion layer materials.

Figure 21:
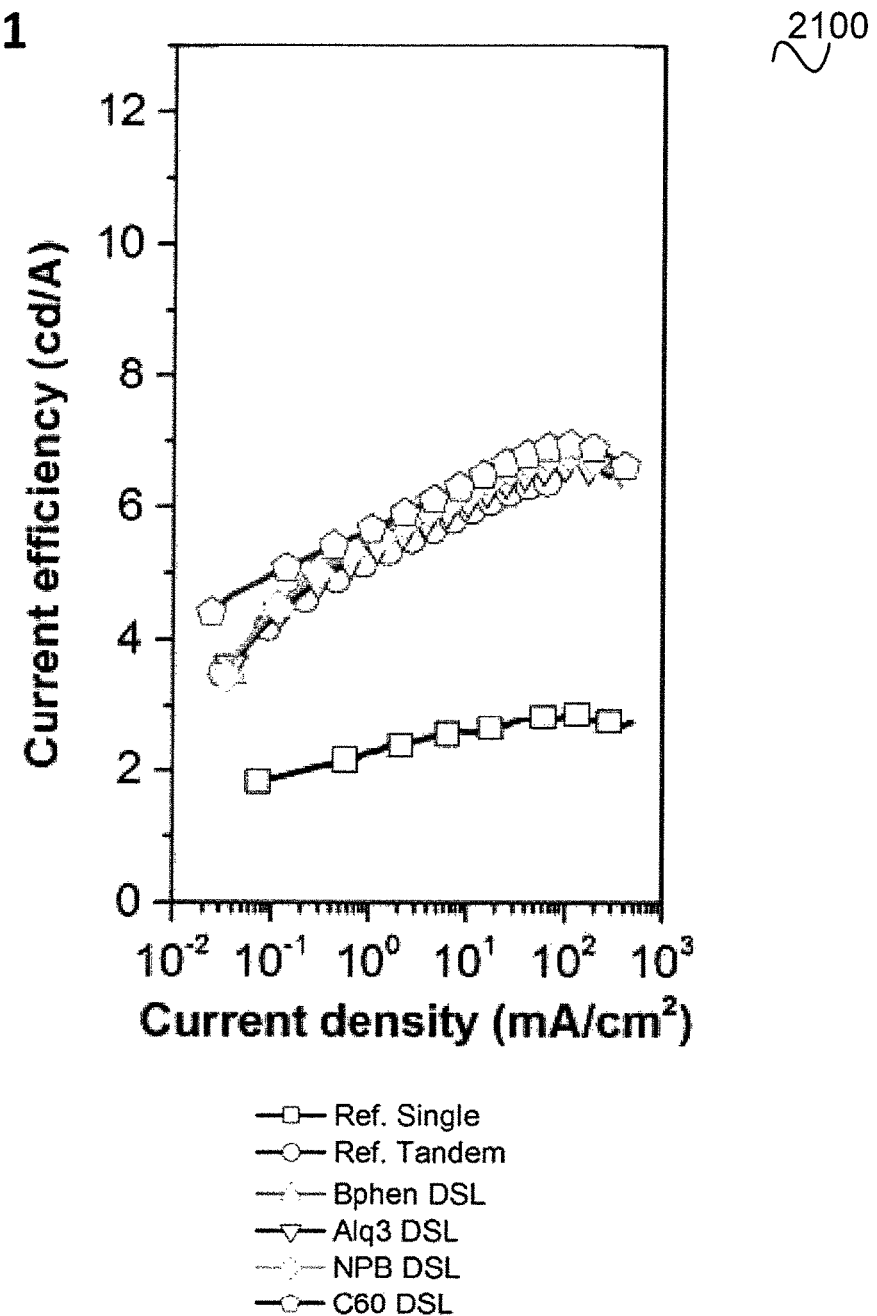
FIG. 21 shows a diagram showing current efficiency vs. current density curves for the tandem OLED for different diffusion layer materials.

FIG. 21 shows a diagram 2100 showing current efficiency vs. current density curves for the tandem OLED 1700 for the different diffusion layer materials.

Figure 22:
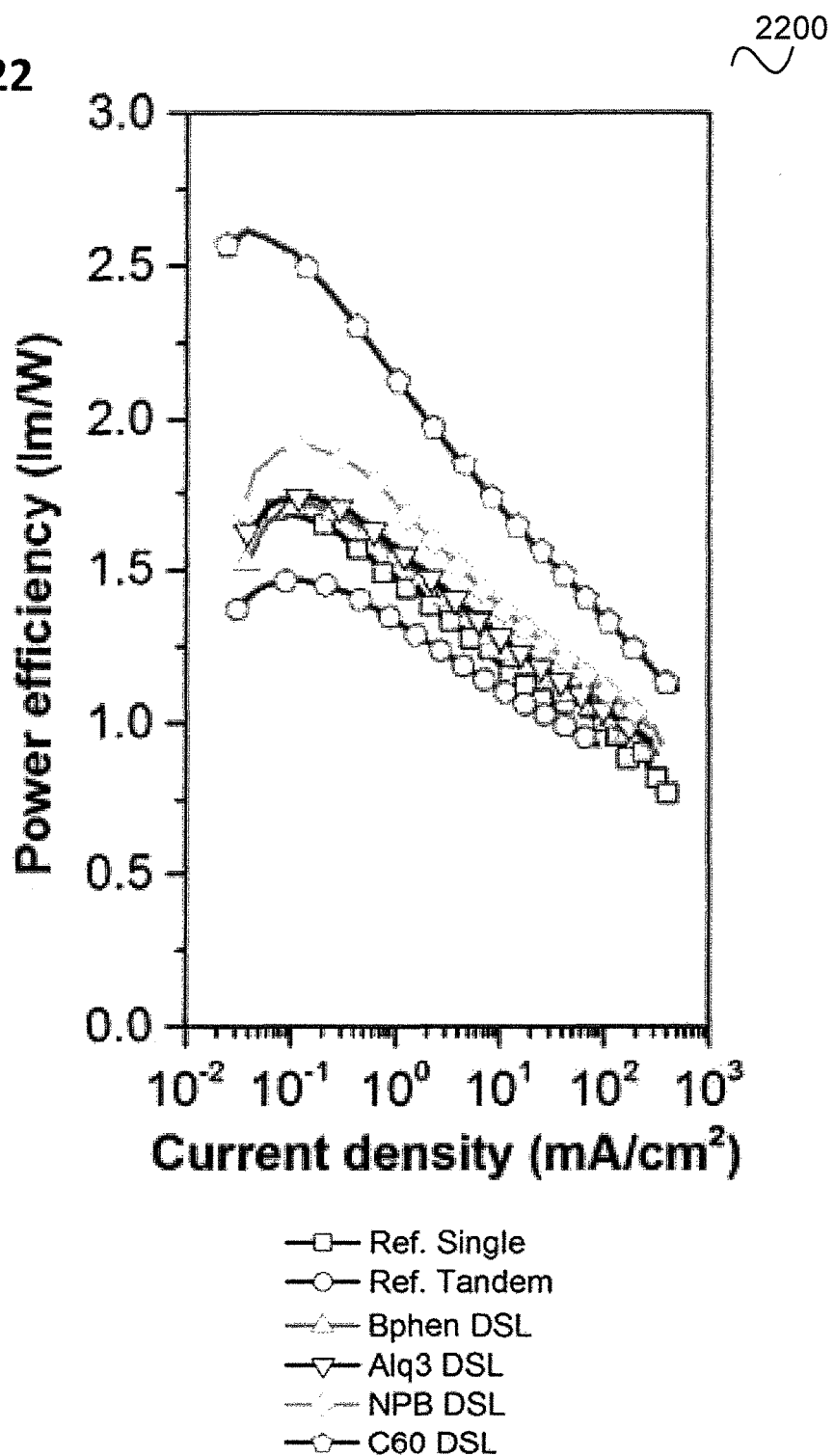
FIG. 22 shows a diagram showing power efficiency vs. current density curves for the tandem OLED for different diffusion layer materials.

FIG. 22 shows a diagram 2200 showing power efficiency vs. current density curves for the tandem OLED 1700 for the different diffusion layer materials.

As shown in FIGS. 18 and 19, compared with the normal tandem OLED 410 without DSL, all the tandem OLED 1700 with DSL shows (for all four materials) reduced driving voltage. FIG. 20 shows a close-up look of FIG. 19. As can be seen, the turn-on voltages are about 5.4, 6.3, 7.0 and 7.1 V for the C60-, NPB-, Alq$_3$- and Bphen-based tandem OLED 1700, respectively, which are much lower than the 8.0 V for the tandem OLED 410 without DSL. For C60 and NPB based devices, the turn-on voltages are even lower than two times of the normal single OLED. This indicates that the DSL 1711 can effectively reduce the voltage loss across the CGL. From FIG. 21, it can be seen that there is a marginal increase in the current efficiency with the addition of DSL. The reduced driving voltage and marginal current efficiency improvement indicate that the power efficiency is enhanced as well. As shown in FIG. 22, compared with the normal tandem OLED 410 without DSL, all the OLED 1700 with DSL show (for all four materials) enhanced power efficiency. The maximum power efficiency for the C60-, NPB-, Alq$_3$- and Bphen-based tandem OLEDs are 2.61, 1.92, 1.74 and 1.71 lm/W respectively, which are much higher than the 1.47 lm/W for the normal tandem OLED 410 without DSL. Compared with the maximum power efficiency (1.69 lm/W) of the normal single OLED 410, the enhancement ratios for the C60- and NPB-based tandem OLED 1700 are 54.4% and 13.6%, respectively, which are mainly derived from the significant voltage reductions. Thus, a DSL-based CGL with simple structure and large enhancement factors can be provided.

In the following, a comparison of the long-term stability of normal tandem OLED without DSL and the normal tandem OLED 1700 with DSL for the four materials mentioned above is given.

Figure 23:
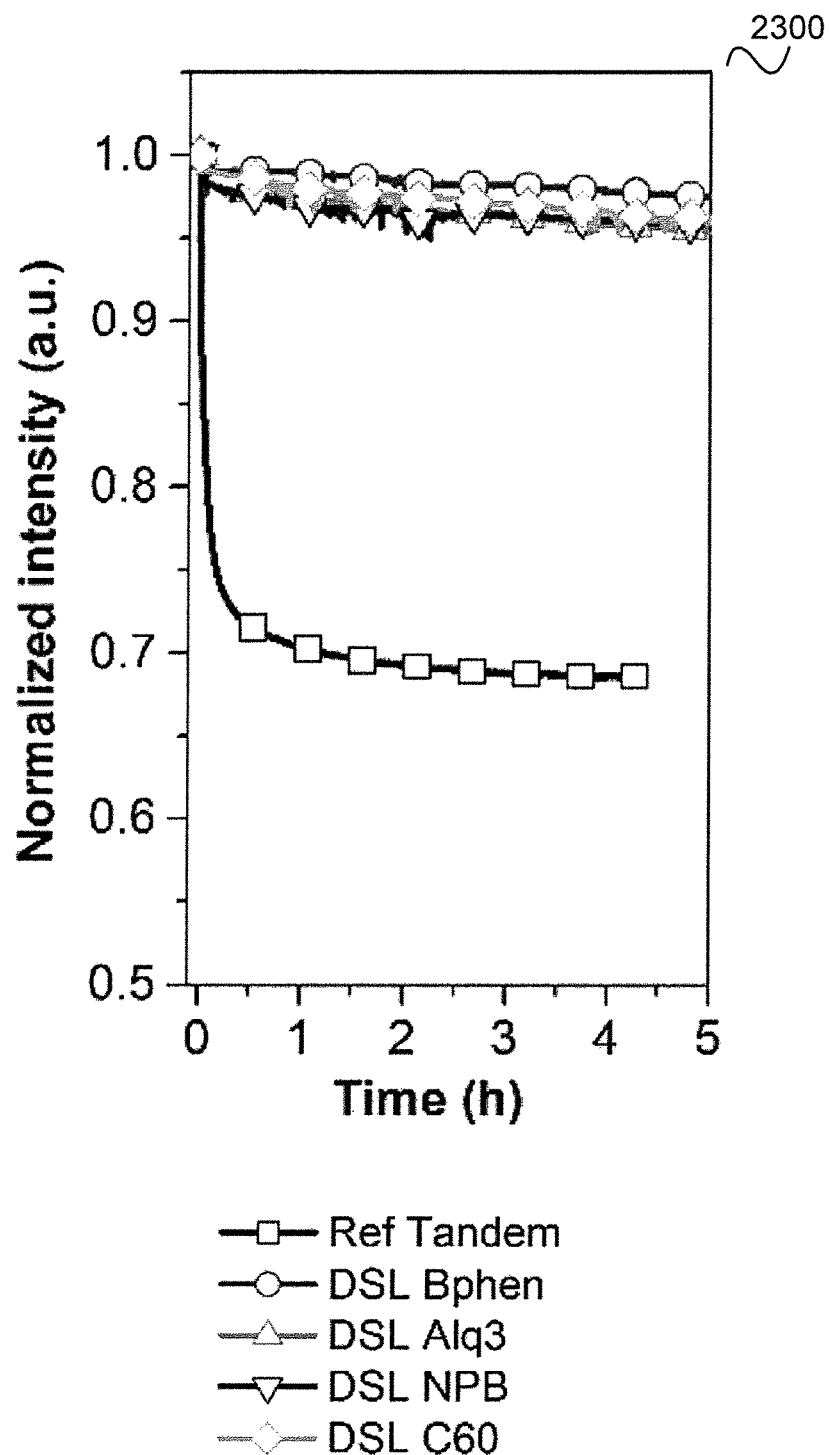
FIG. 23 shows a diagram showing luminance degradation for the normal tandem OLED without DSL (diffusion suppressing layer) and the normal tandem OLED with DSL for different diffusion layer materials.

FIG. 23 shows a diagram 2300 showing luminance degradation for the normal tandem OLED 410 without DSL and the normal tandem OLED 1700 with DSL for the four materials.

Figure 24:
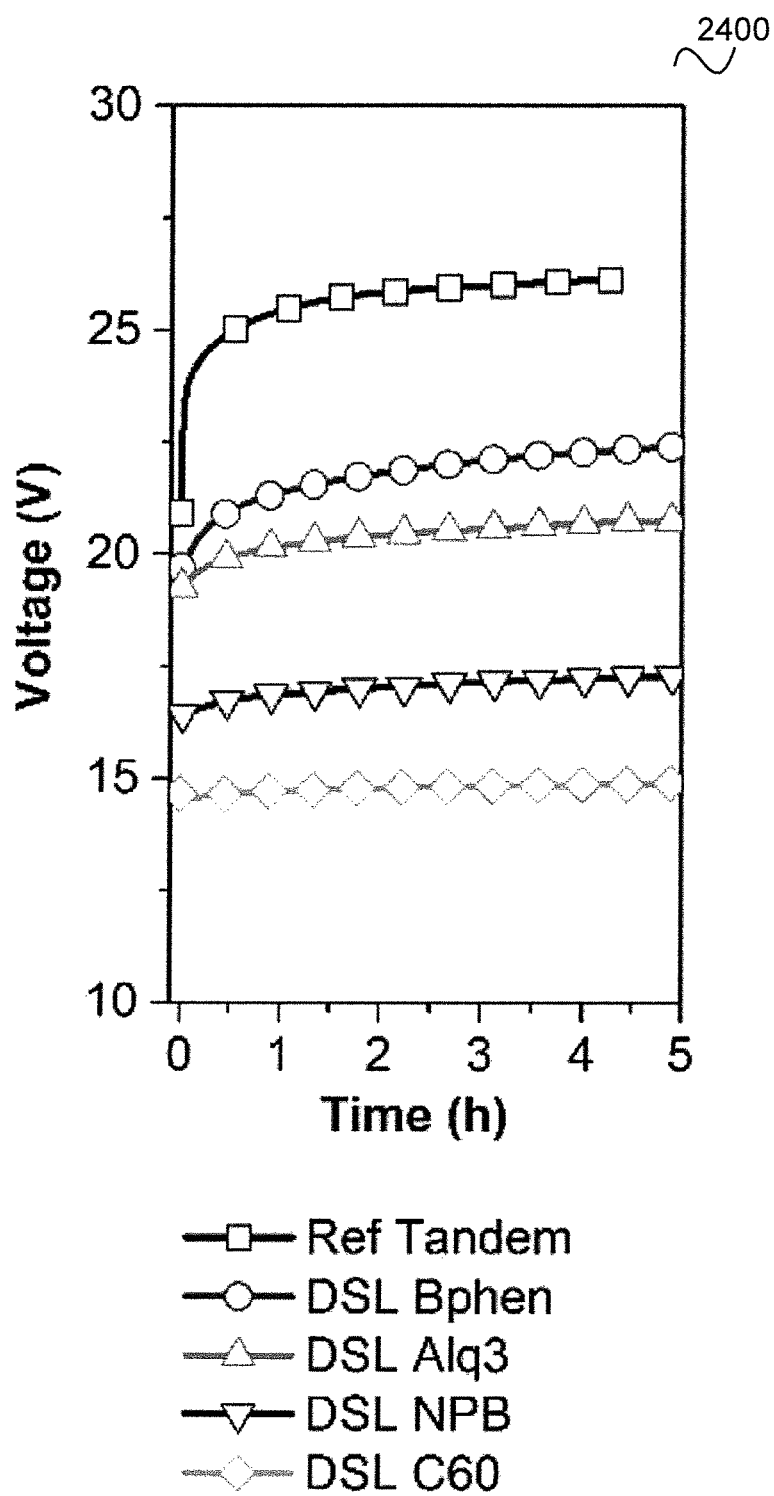
FIG. 24 shows a diagram showing voltage degradation for the normal tandem OLED without DSL and the normal tandem OLED with DSL for different diffusion layer materials.

FIG. 24 shows a diagram 2400 showing voltage degradation for the normal tandem OLED 410 without DSL and the normal tandem OLED 1700 with DSL for the four materials.

Figure 25:
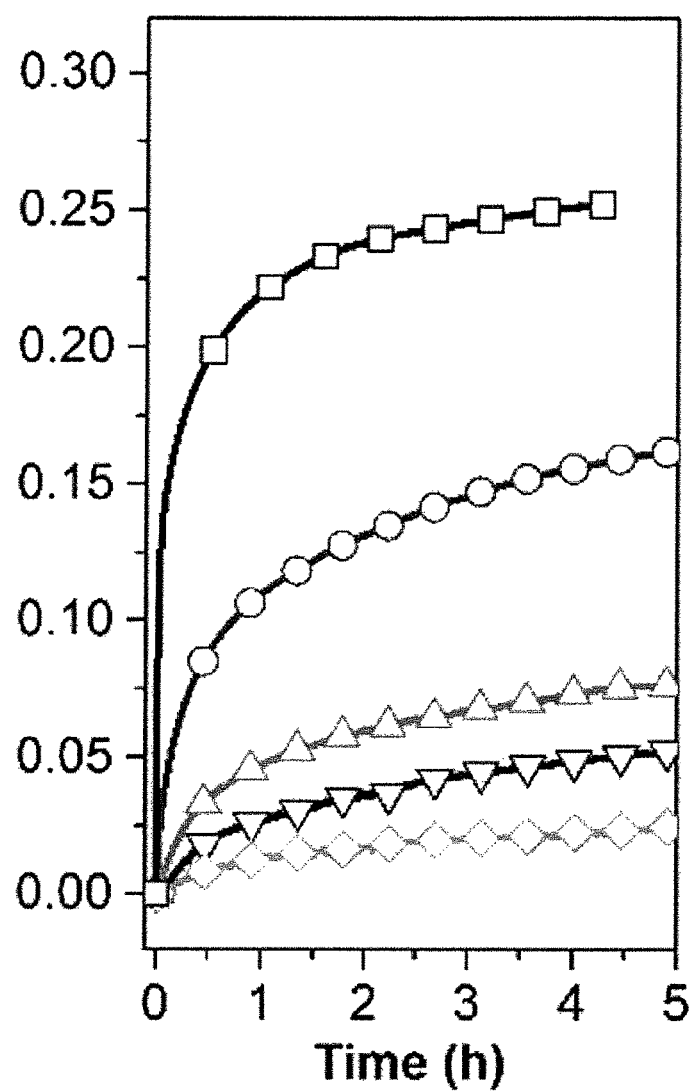
FIG. 25 shows a diagram showing voltage changing ratio curves for the curves of FIG. 24.

FIG. 25 shows a diagram 2500 showing voltage changing ratio curves for the curves of FIG. 24.

Figure 26:
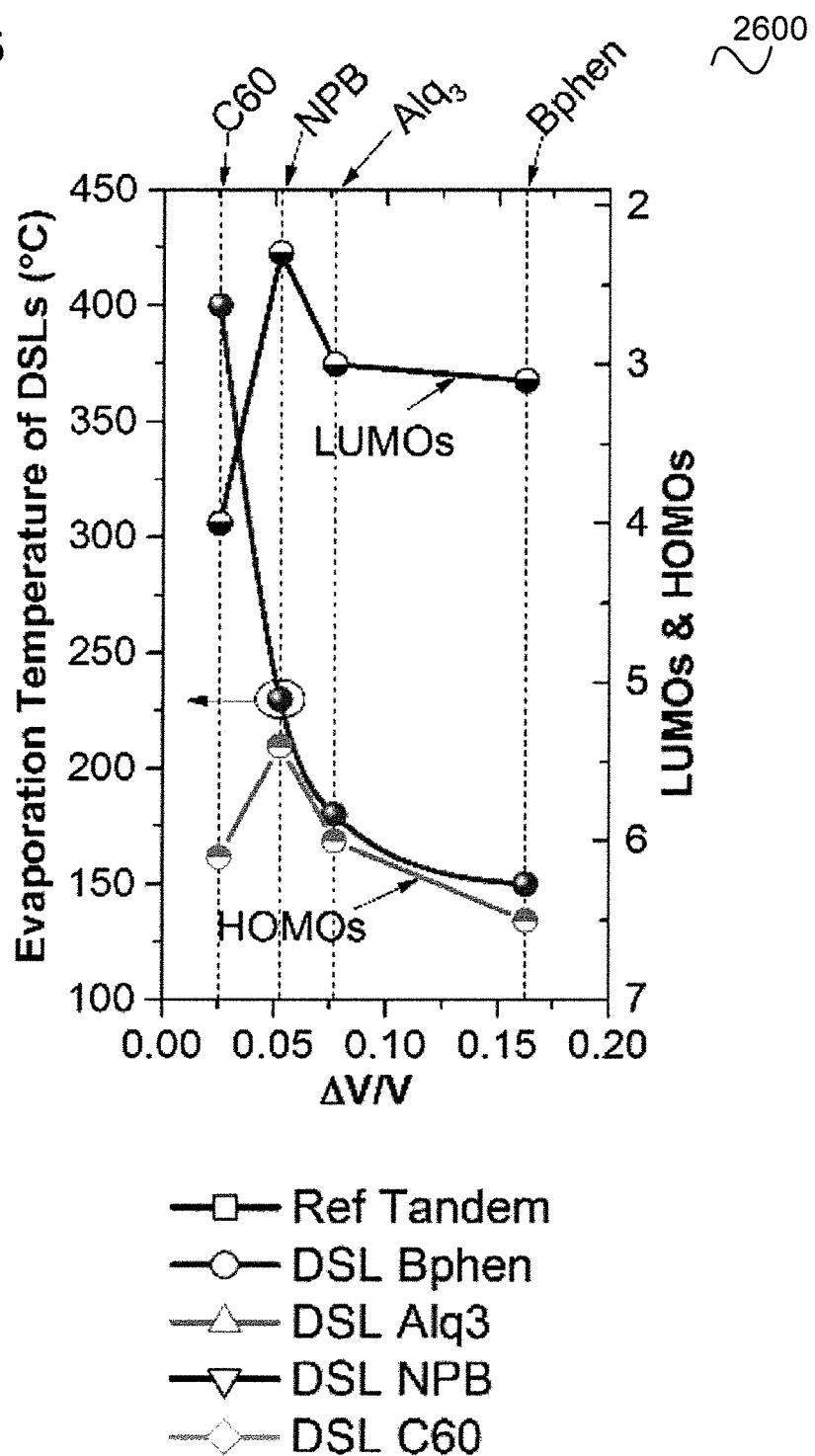
FIG. 26 shows a diagram showing dependences of voltage changing ratio on energy levels (LUMOs (lowest unoccupied molecular orbitals) and HOMOs (highest unoccupied molecular orbitals)) and evaporation temperatures of the DSLs for the normal tandem OLED 410 without DSL and the normal tandem OLED 1700 with DSL for different diffusion layer materials.

FIG. 26 shows a diagram 2600 showing dependences of voltage changing ratio on energy levels (LUMOs and HOMOs) and evaporation temperatures of the DSLs for the normal tandem OLED 410 without DSL and the normal tandem OLED 1700 with DSL 1711 for the four materials.

As shown in FIG. 23, as can be expected, the tandem OLED 1700 with DSL 1711 shows, for all four materials, great improvement in term of luminance degradation and the difference between the materials is very marginal. There is also improvement for the voltage degradation, as can be seen in FIG. 24, but there is some difference between the four materials. The voltage increase ratios for the four materials are shown in FIG. 25 and it follows an order of $\Delta V(Bphen) > \Delta V(Alq_3) > \Delta V(NPB) > \Delta V(C60)$.

To link the voltage degradation to the properties of the DSLs of the four materials, $\Delta V$ is plot against the thermal evaporation temperatures ($T_{evap}$) and energy levels (HOMOs and LUMOs) of the DSLs. As shown in FIG. 26, $\Delta V$ shows clear dependence on $T_{evap}$, the higher $T_{evap}$ the smaller $\Delta V$, while there is no clear relation between the HOMOs/LUMOs and $\Delta V$. Actually, the $T_{evap}$ reflects the thermal stability of the DSLs, the one with higher $T_{evap}$ has better resistance to the diffusion of $MoO_3$ and the resulting tandem OLED shows better stability. While due to there being no clear relation between the long-term stability and energy levels of DSLs, the energy level alignment in this type CGL seems not that important. In view of the above, it can be seen that the fast degradation of the normal tandem OLED without the DSL is due to the diffusion of $MoO_3$ into Bphen:$Cs_2CO_3$ layer and this diffusion process can be suppressed by inserting a thin DSL. Thus, the turn-on voltage difference shown in FIG. 26 can be understood. Since the diffusion of $MoO_3$ happens at the device fabrication process, there is already somewhat degradation before the measurements were made. Thus the device has larger turn-on voltage if the corresponding DSL has less resistance to the $MoO_3$ diffusion.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. An organic light emitting device comprising:
   a substrate comprising glass;
   an indium tin oxide (ITO) layer arranged over the substrate;
   a molybdenum trioxide ($MoO_3$) layer arranged over the indium tin oxide (ITO) layer;
   a first light emitting unit arranged over the molybdenum trioxide ($MoO_3$) layer;
   a second light emitting unit; and
   a charge generation layer;
   wherein the second light emitting unit is stacked over the first light emitting unit and is connected to the first light emitting unit by means of the charge generation layer; and
   wherein the charge generation layer comprises:
   an electron transport layer comprising Bathophenanthroline (Bphen) doped with caesium carbonate ($Cs_2CO_3$);
   a transition metal oxide layer, the transition metal oxide layer comprising molybdenum trioxide ($MoO_3$), arranged over the electron transport layer of the charge generation layer; and
   a diffusion suppressing layer arranged between the electron transport layer of the charge generation layer and the transition metal oxide layer of the charge generation layer to separate the electron transport layer of the charge generation layer from the transition metal oxide layer of the charge generation layer;
   wherein the diffusion suppressing layer is formed of Buckminsterfullerene;
   wherein the first light emitting unit comprises:
   a hole transport layer comprising ninhydrin petroleum ether (NPB); and
   an electron transport layer, the electron transport layer comprising Tris(8-hydroxyquinolinato)aluminium ($Alq_3$) arranged over the hole transport layer of the first light emitting unit;
   wherein the second light emitting unit comprises:
   a hole transport layer comprising ninhydrin petroleum ether (NPB); and
   an electron transport layer, the first electron transport layer comprising Tris(8-hydroxyquinolinato)aluminium ($Alq_3$) arranged over the hole transport layer of the second light emitting unit; and
   a cathode over the second light emitting unit, the cathode comprising caesium carbonate and aluminium ($Cs_2CO_3$/Al).

* * * * *